(12) United States Patent
Umemoto et al.

(10) Patent No.: US 11,817,356 B2
(45) Date of Patent: Nov. 14, 2023

(54) SEMICONDUCTOR DEVICE

(71) Applicant: Murata Manufacturing Co., Ltd., Kyoto-fu (JP)

(72) Inventors: Yasunari Umemoto, Nagaokakyo (JP); Shigeki Koya, Nagaokakyo (JP); Isao Obu, Nagaokakyo (JP); Kaoru Ideno, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/559,958

(22) Filed: Dec. 22, 2021

(65) Prior Publication Data
US 2022/0115272 A1 Apr. 14, 2022

Related U.S. Application Data

(63) Continuation of application No. 16/869,275, filed on May 7, 2020, now Pat. No. 11,227,804.

(30) Foreign Application Priority Data

May 8, 2019 (JP) ................................ 2019-088387

(51) Int. Cl.
*H01L 29/66* (2006.01)
*H01L 21/8252* (2006.01)
(Continued)

(52) U.S. Cl.
CPC ........ *H01L 21/8252* (2013.01); *H01L 29/157* (2013.01); *H01L 29/66333* (2013.01); *H01L 29/7371* (2013.01)

(58) Field of Classification Search
CPC ........... H01L 21/8252; H01L 29/66333; H01L 29/7371; H01L 29/157; H01L 29/66242;
(Continued)

(56) References Cited

U.S. PATENT DOCUMENTS

2005/0156194 A1* 7/2005 Ohbu .................. H01L 27/0605
257/E29.189
2006/0138460 A1* 6/2006 Sasaki ................. H01L 29/7304
257/E29.189
(Continued)

FOREIGN PATENT DOCUMENTS

JP 2005011951 A 1/2005

*Primary Examiner* — Shahed Ahmed
(74) *Attorney, Agent, or Firm* — Studebaker & Brackett PC

(57) ABSTRACT

A collector layer, a base layer, an emitter layer, and an emitter mesa layer are placed above a substrate in this order. A base electrode and an emitter electrode are further placed above the substrate. The emitter mesa layer has a long shape in a first direction in plan view. The base electrode includes a base electrode pad portion spaced from the emitter mesa layer in the first direction. An emitter wiring line and a base wiring line are placed on the emitter electrode and the base electrode, respectively. The emitter wiring line is connected to the emitter electrode via an emitter contact hole. In the first direction, the spacing between the edges of the emitter mesa layer and the emitter contact hole on the side of the base wiring line is smaller than that between the emitter mesa layer and the base wiring line.

18 Claims, 14 Drawing Sheets

(51) Int. Cl.
*H01L 29/737* (2006.01)
*H01L 29/15* (2006.01)

(58) Field of Classification Search
CPC .......... H01L 29/0692; H01L 29/66318; H01L 27/0823; H01L 29/737; H01L 29/42304; H01L 27/0647–067; H01L 27/075–0783; H01L 29/04–045; H01L 29/0804–0817; H01L 29/0821–0826; H01L 29/16–1608; H01L 2924/13051; H01L 23/522–53295; H01L 21/768–76898
See application file for complete search history.

(56) References Cited

U.S. PATENT DOCUMENTS

| | | | |
|---|---|---|---|
| 2007/0241427 A1* | 10/2007 | Mochizuki | H01L 29/1608 257/586 |
| 2009/0057685 A1* | 3/2009 | Mochizuki | H01L 29/7322 257/77 |
| 2017/0243939 A1* | 8/2017 | Obu | H01L 29/41708 |
| 2018/0240898 A1* | 8/2018 | Tao | H01L 29/7371 |
| 2019/0109066 A1* | 4/2019 | Kondo | H01L 29/0649 |

* cited by examiner

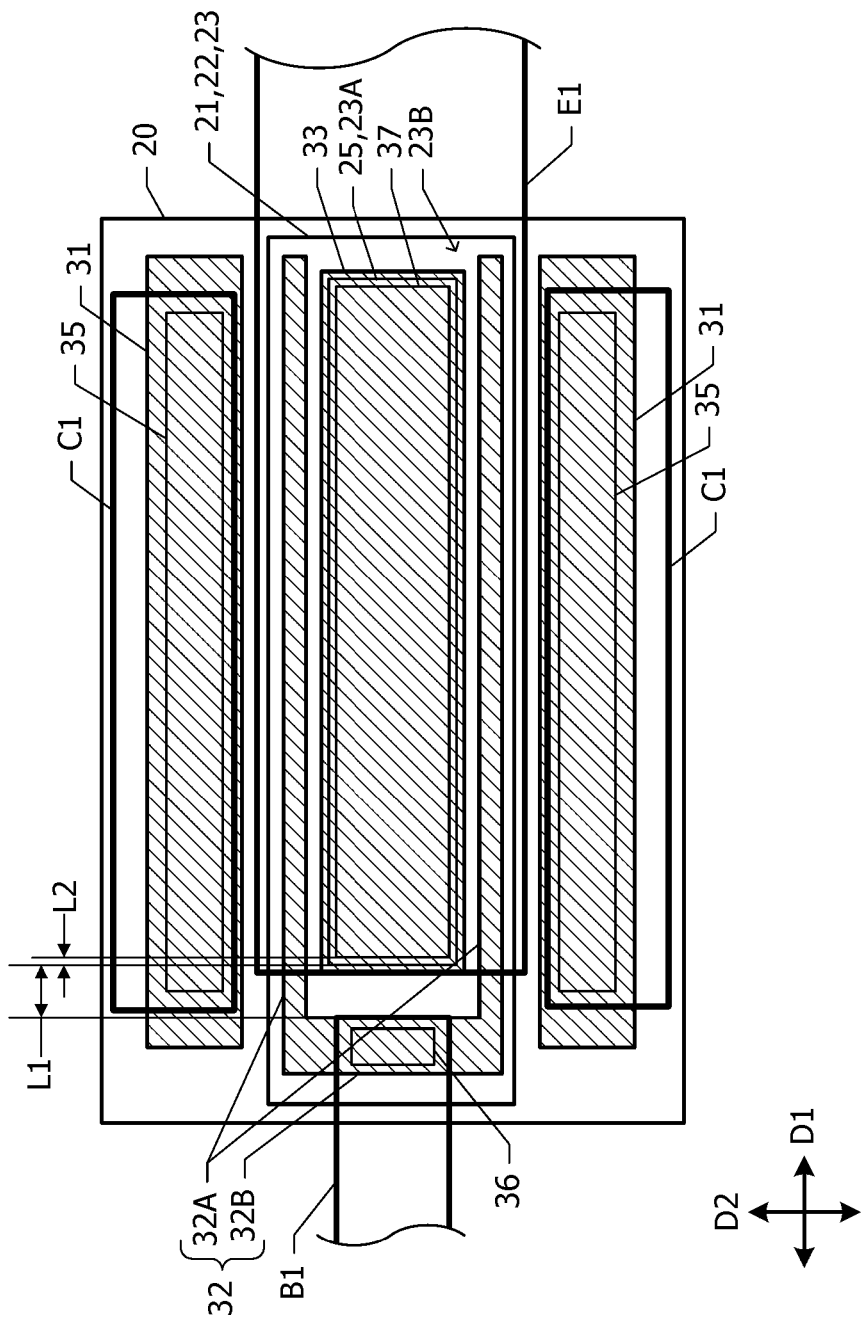

SEMICONDUCTOR DEVICE

CROSS-REFERENCE TO RELATED APPLICATIONS

This application is a Continuation of U.S. patent application Ser. No. 16/869,275 filed May 7, 2020, which claims benefit of priority to Japanese Patent Application No. 2019-088387, filed May 8, 2019, the entire content of which is incorporated herein by reference.

BACKGROUND

Technical Field

The present disclosure relates to a semiconductor device.

Background Art

As active elements forming a power amplifier module for amplifying a high-frequency signal in a mobile terminal, heterojunction bipolar transistors (HBTs) are mainly used, as described, for example, in Japanese Unexamined Patent Application Publication No. 2005-11951. Desirable characteristics required for the HBTs include various items such as high efficiency, high gain, high output, and high withstand voltage. In envelope tracking systems, which have recently attracted attention, HBTs that operate at a high collector voltage are required. In order to realize high-voltage operation of HBTs, it is necessary to extend the safe operating area (SOA).

SUMMARY

When a collector voltage of an HBT is increased in a graph representing collector current-collector voltage characteristics (Ic-Vce characteristics), a boundary line (SOA line) between the inside and outside of the SOA gradually decreases. From evaluation experiments conducted by the inventors of the present application, a phenomenon that the SOA line discontinuously decreases at a certain collector voltage was found to occur. The collector voltage at which the SOA line discontinuously decreases is referred to as a "transition voltage".

At an operating voltage that is substantially equal to or higher than the transition voltage, the risk that the actual operating range becomes out of the SOA increases when the change in a load occurs during the operation of an HBT. If the operating range is out of the SOA, the HBT may be damaged. It is desirable to extend the SOA by increasing the transition voltage to cause the HBT to operate at a high collector voltage without being damaged even at the occurrence of the change in a load.

Accordingly the present disclosure provides a semiconductor device with which the SOA can be extended by increasing the transition voltage.

According to preferred embodiments of the present disclosure, there is provided a semiconductor device that includes a collector layer, a base layer, an emitter layer, and an emitter mesa layer which are placed above a substrate. The emitter mesa layer is placed on a partial region of the emitter layer in plan view and has a shape that is long in a first direction in plan view. The semiconductor device further includes a base electrode that is placed in a region not overlapping the emitter mesa layer in plan view, flows a base current through the base layer, and includes a base electrode main portion and a base electrode pad portion. The base electrode main portion has a shape that is long in the first direction in plan view and is spaced from the emitter mesa layer in a second direction orthogonal to the first direction. The base electrode pad portion is continuous with the base electrode main portion and is spaced from the emitter mesa layer in the first direction. The semiconductor device still further includes an emitter electrode that is placed on the emitter mesa layer and flows an emitter current through the emitter mesa layer, an insulating film that is placed on the emitter electrode and the base electrode and includes an emitter contact hole and a base contact hole included within the emitter electrode and the base electrode pad portion, respectively in plan view, an emitter wiring line that is placed on the insulating film and is connected to the emitter electrode via the emitter contact hole, and a base wiring line that is placed on the insulating film and is connected to the base electrode pad portion via the base contact hole. A spacing between an edge of the emitter mesa layer on a side of the base wiring line and an edge of the emitter contact hole on a side of the base wiring line is smaller than a spacing between the emitter mesa layer and the base wiring line.

When the spacing between the edge of the emitter mesa layer on the side of the base wiring line and the edge of the emitter contact hole on the side of the base wiring line is set to be smaller than the spacing between the emitter mesa layer and the base wiring line in the first direction, the transition voltage is increased. As a result, the advantageous effect of the extension of the SOA can be obtained.

Other features, elements, characteristics and advantages of the present disclosure will become more apparent from the following detailed description of preferred embodiments of the present disclosure (with reference to the attached drawings).

BRIEF DESCRIPTION OF THE DRAWINGS

FIG. 14 is a diagram illustrating the planar layout of a plurality of components in a semiconductor device according to a third embodiment.

DETAILED DESCRIPTION

Before the description of embodiments, one factor that inhibits the extension of the SOA in a typical HBT will be described with reference to FIGS. 1 to 3 on the basis of evaluation experiments conducted by the inventors of the present application.

Figure 1:
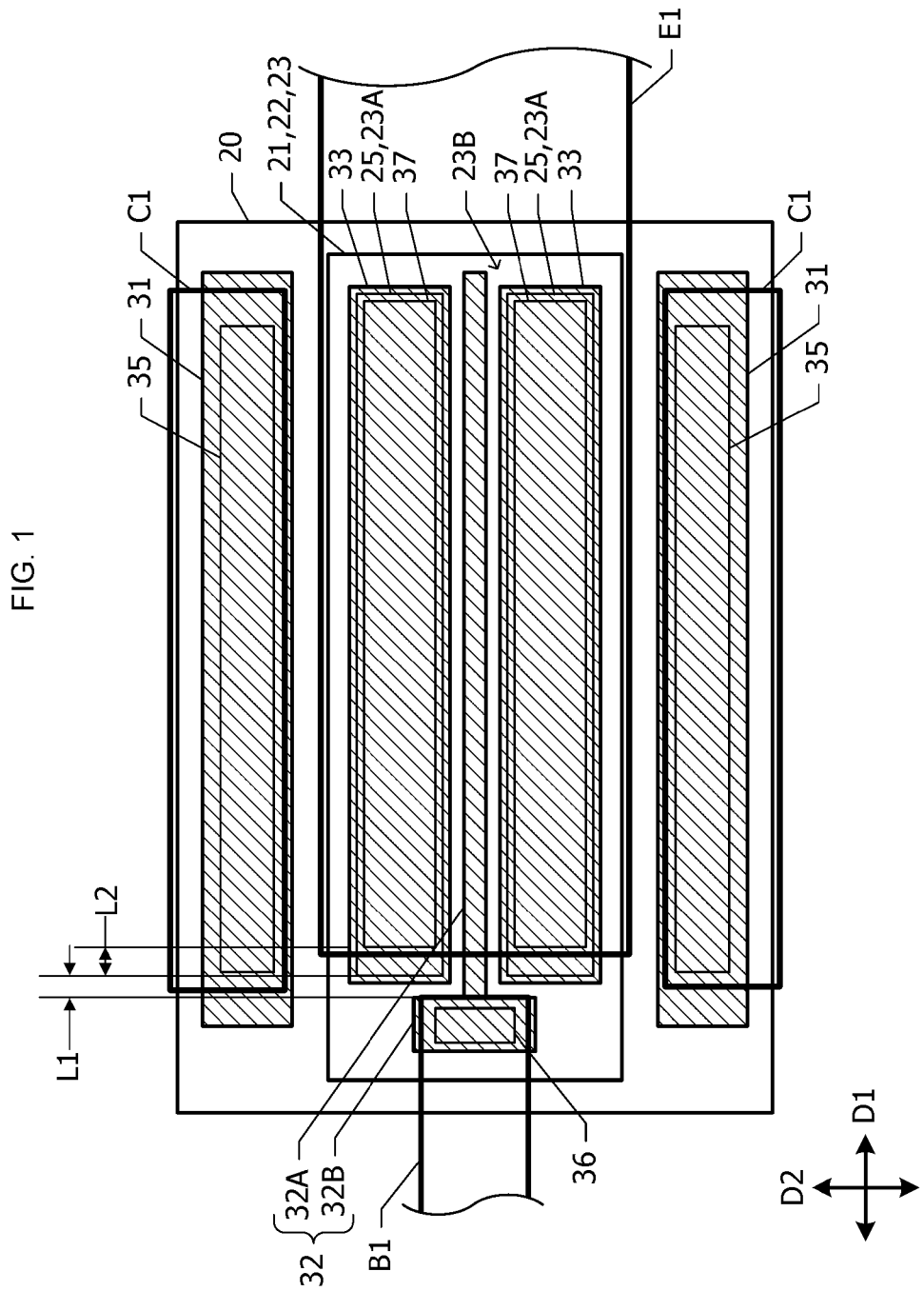
FIG. 1 is a diagram illustrating the planar layout of a plurality of components in an HBT that is a reference example for evaluation experiments.

FIG. 1 is a diagram illustrating the planar layout of a plurality of components in an HBT that is a reference example for evaluation experiments. A sub-collector layer 20 made of a semiconductor having conductivity is provided on a surface-layer portion of a substrate. A collector layer 21, a base layer 22, and an emitter layer 23 are placed on a partial region of the sub-collector layer 20. The collector layer 21, the base layer 22, and the emitter layer 23 substantially overlap in plan view, and are placed inside the sub-collector layer 20 in plan view. Emitter mesa layers 25 are placed on respective two regions inside the upper surface of the emitter layer 23. The collector layer 21, the base layer 22, the emitter layer 23, and the emitter mesa layer 25 form a bipolar transistor, e.g., an HBT.

Each of the emitter mesa layers 25 has a planar shape that is long in one direction (the lateral direction in FIG. 1) in plan view. The emitter mesa layer 25 is, for example, substantially rectangular in shape in plan view. The longitudinal direction of the emitter mesa layer 25 is defined as a first direction D1, and a direction orthogonal to the first direction D1 in plan view is defined as a second direction D2. The two emitter mesa layers 25 are spaced from each other in the second direction D2. Emitter electrodes 33 are placed on the two respective emitter mesa layers 25. Referring to FIG. 1, the emitter electrodes 33 are hatched. In plan view, the emitter electrode 33 slightly outwardly protrudes from the edge of the emitter mesa layer 25. The emitter electrode 33 is formed of a metal and is in ohmic contact with the emitter mesa layer 25.

A region of the emitter layer 23 overlapping the emitter mesa layer 25 in plan view operates as an emitter in the HBT. In this specification, the portion of the emitter layer 23 overlapping the emitter mesa layer 25 is referred to as an intrinsic emitter layer 23A. The portion of the emitter layer 23 which does not overlap the emitter mesa layer 25 in plan view is referred to as a ledge layer 23B. The ledge layer 23B is depleted, and a current does not substantially flow therethrough.

A base electrode 32 having a planar shape similar to the form of the letter T is placed on the ledge layer 23B. The base electrode 32 is connected to the base layer 22 via the ledge layer 23B by alloying processing to flow a base current through the base layer 22. Referring to FIG. 1, the base electrode 32 is hatched. The base electrode 32 includes a base electrode main portion 32A and a base electrode pad portion 32B. The base electrode main portion 32A is placed between the two emitter mesa layers 25 and has a shape that is long in the first direction D1 in plan view. The base electrode pad portion 32B is spaced from one end portion of the emitter mesa layer 25 in the longitudinal direction (the edge of the emitter mesa layer 25 parallel to the second direction D2) and is continuous with the base electrode main portion 32A.

Inside the sub-collector layer 20, collector electrodes 31 are placed on both sides of the collector layer 21 in the second direction D2. Referring to FIG. 1, the collector electrodes 31 are hatched. That is, the two collector electrodes 31 are placed to sandwich the collector layer 21 in the second direction D2. Each of the collector electrodes 31 has a shape that is long in the first direction D1 in plan view. The collector electrode 31 is connected to the collector layer 21 via the sub-collector layer 20.

An insulating film is placed on the collector electrode 31, the base electrode 32, and the emitter electrode 33. On the insulating film, a collector wiring line C1, a base wiring line B1, and an emitter wiring line E1 are placed to overlap the collector electrode 31, the base electrode pad portion 32B, and the emitter electrode 33, respectively, in plan view. The base wiring line B1 is spaced from the emitter mesa layer 25 and the emitter electrode 33 in the first direction D1.

The collector wiring line C1 is connected to the collector electrode 31 via a collector contact hole 35 formed in the insulating film beneath the collector wiring line C1. The base wiring line B1 is connected to the base electrode 32 via a base contact hole 36 formed in the insulating film beneath the base wiring line B1. The emitter wiring line E1 is connected to the emitter electrode 33 via an emitter contact hole 37 formed in the insulating film beneath the emitter wiring line E1.

The emitter contact hole 37 is placed inside the emitter electrode 33 in plan view and has a shape that is long in the first direction D1. The collector contact hole 35 is placed inside the collector electrode 31 in plan view and has a shape that is long in the first direction D1. The base contact hole 36 is placed inside the base electrode pad portion 32B in plan view.

The emitter wiring line E1 extends in a direction away from the base electrode pad portion 32B and the base wiring line B1. The base wiring line B1 extends in a direction away from the emitter mesa layer 25 and the emitter wiring line E1. On the emitter wiring line E1, the collector wiring line C1, and the base wiring line B1, second-layer wiring lines may be placed.

The emitter mesa layer 25 and the emitter electrode 33 are substantially symmetric in plan view in the first direction D1 and the second direction D2. That is, the positional relationship between the edges of the emitter mesa layer 25 and the emitter electrode 33 at one end in the first direction D1 and the positional relationship between the edges of the emitter mesa layer 25 and the emitter electrode 33 at the other end in the first direction D1 are mirror symmetric. The positional relationship between the edges of the emitter mesa layer 25 and the emitter electrode 33 parallel to the first direction is mirror symmetric with respect to a symmetric axis that is a line parallel to the first direction D1. The spacing between the edges of the emitter mesa layer 25 and the base electrode main portion 32A in the second direction D2 is substantially constant.

To suppress the reduction in radio-frequency characteristics of an HBT, it is desirable that a base-collector junction capacitance Cbc be as small as possible. That is, it is desirable that the dimensions of the collector layer 21 and the base layer 22 in plan view be as small as possible. To reduce the dimensions of the collector layer 21 and the base layer 22, the spacing between the base electrode pad portion 32B and the emitter mesa layer 25 in the first direction D1 is made to be narrow and the dimension of the base electrode pad portion 32B in the first direction D1 is made to be small.

The base wiring line B1 is placed to substantially overlap the base electrode pad portion 32B for the reduction in the dimensions of the collector layer 21 and the base layer 22. The edge of the base wiring line B1 facing the emitter mesa layer 25 therefore approaches the emitter mesa layer 25. Since the emitter wiring line E1 and the base wiring line B1 are placed at the same wiring line layer, the spacing between them cannot be smaller than the minimum spacing determined on the basis of the design rule of the wiring line layer. The minimum spacing determined on the basis of the design rule of the wiring line layer is typically larger than the spacing between the base electrode pad portion 32B and the emitter mesa layer 25. As a result, the emitter wiring line E1 is placed at a position farther from the base electrode pad portion 32B than the emitter mesa layer 25. The emitter contact hole 37, which is included in the emitter wiring line E1 in plan view, is placed at a position farther from the base electrode pad portion 32B than the emitter wiring line E1.

The spacing between the base wiring line B1 and the emitter mesa layer 25 in the first direction D1 is represented by L1, and the spacing between the edge of the emitter mesa layer 25 on the side of the base wiring line B1 and the edge of the emitter contact hole 37 on the side of the base wiring line B1 in the first direction D1 is represented by L2. When the components are placed on the basis of the above-described design rule, the spacing L2 is usually larger than the spacing L1.

A monolithic microwave integrated circuit (MMIC) element incorporating a power amplifier includes the plurality of HBTs illustrated in FIG. 1. The HBTs are electrically connected to one another via the emitter wiring line E1, the collector wiring line C1, the base wiring line B1, the second-layer wiring lines, etc. either directly or indirectly with an element such as a resistor. Thus, a power-stage or driver-stage power amplifier is formed.

Figure 2:
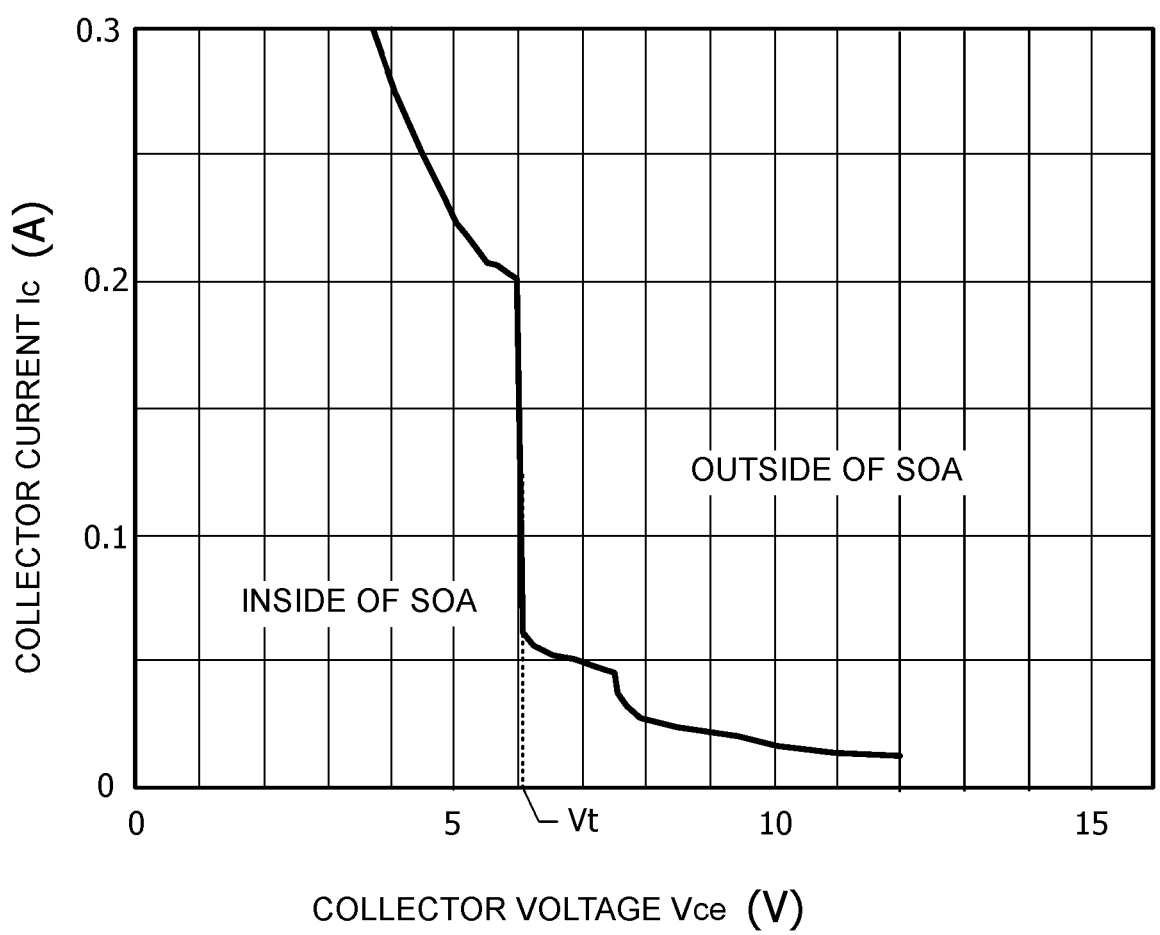
FIG. 2 is a graph representing an actual measurement result of an SOA line of an HBT that is a reference example.

FIG. 2 is a graph representing an actual measurement result of an SOA line of an HBT. The horizontal axis represents a collector voltage Vce in units of "V", and the vertical axis represents a collector current Ic in units of "A". A region on the lower voltage side of the SOA line corresponds to the inside of the SOA, and a region on the higher voltage side of the SOA line corresponds to the outside of the SOA.

The graph indicates that the SOA line markedly discontinuously decreases from the collector voltage Vce of approximately 6 V with the increase in the collector voltage Vce. The collector voltage Vce at which the SOA line discontinuously decreases corresponds to a transition voltage Vt.

In the reference example illustrated in FIGS. 1 and 2, the number of the emitter electrode 33 is two and the number of the base electrode main portion 32A is one. In HBTs having other combinations of the number of the emitter electrodes 33 and the number of the base electrode main portions 32A, the SOA line discontinuous decrease is similarly confirmed. For example, in an HBT including the one emitter electrode 33 and the one base electrode main portion 32A, an HBT including the one emitter electrode 33 and the two base electrode main portions 32A, an HBT including the two emitter electrodes 33 and the three base electrode main portions 32A, and an HBT including the three emitter electrodes 33 and the four base electrode main portions 32A, the SOA line discontinuous decrease is also confirmed.

Figure 3:
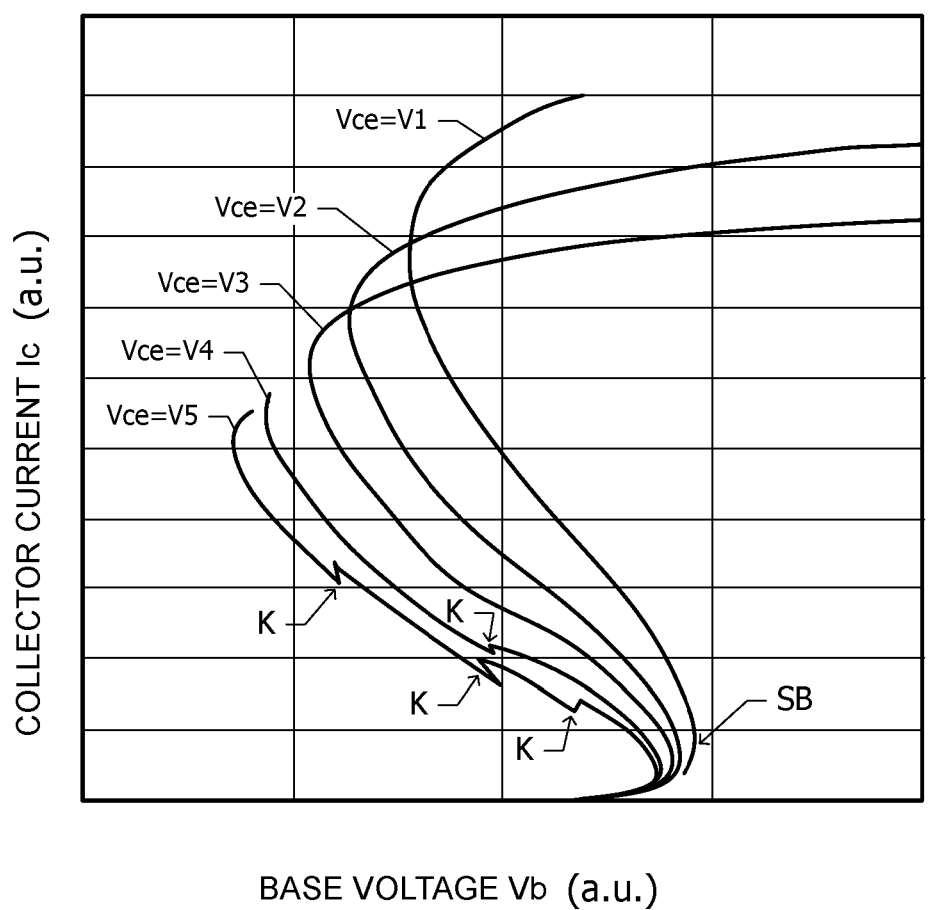
FIG. 3 is a graph representing actual measurement results of collector current-base voltage characteristics (Ic-Vb characteristics)

FIG. 3 is a graph representing actual measurement results of collector current-base voltage characteristics (Ic-Vb characteristics). The horizontal axis represents a base voltage Vb in arbitrary units, and the vertical axis represents the collector current Ic in arbitrary units. In the measurement, the collector current Ic and the base voltage Vb were measured while keeping the collector voltage Vice constant and sweeping the magnitude of a base current Ib with a current source. The measurement was conducted at a plurality of voltages of the collector voltage Vce=V1, V2, V3, V4, and V5. Here, the magnitude relationship among the voltages V1 to V5 is V1<V2<V3<V4<V5.

In a range where the collector current Ic is small, the slope of the collector current Ic with respect to the base voltage Vb gradually increases with the increase in the base voltage Vb. When the collector current Ic further increases, a snapback point SB at which the slope of the collector current Ic with respect to the base voltage Vb is infinite appears. When the collector current Ic is further increased beyond the snapback point SB, the slope of the collector current Ic with respect to the base voltage Vb changes to negative and the base voltage Vb decreases with the increase in the collector current Ic.

When the collector voltage Vice is V4 and V5, a kink K at which the collector current Ic discontinuously decreases appears after the collector current Ic has passed through the snapback point SB. When the collector voltage Vice is V1, V2, and V3 lower than V4 and V5, the kink K does not appear. The minimum collector voltage Vice at which the kink K appears corresponds to the transition voltage Vt (FIG. 2). "The kink K" means a characteristic region where a temporary increase in the base voltage Vb or a temporary decrease in the collector current Ic appears in a region where the base voltage Vb decreases and the collector current Ic increases in the Ic-Vb characteristics (see FIG. 3).

Next, a description will be made of a reason why the kink K appears in a region beyond the snapback point SB in the collector current-base voltage characteristics.

The appearance of the kink K is considered to occur because of a thermal or electrical asymmetry of an HBT. The arrangement of the emitter mesa layer 25 and the emitter electrode 33 is substantially symmetry in the first direction D1 in plan view. However, the arrangement of the emitter mesa layer 25 and the emitter contact hole 37 is not symmetry in the first direction D1. The base electrode pad portion 32B is placed only near one end portion of the emitter mesa layer 25 and is not placed near the other end portion of the emitter mesa layer 25. The end portion of the emitter mesa layer 25 on the side of the base wiring line B1 does not overlap the emitter wiring line E1, but the other end portion of the emitter mesa layer 25 overlaps the emitter wiring line E1. Thus, thermal and electrical asymmetry factors are present for the one emitter mesa layer 25 in the first direction D1.

Before the collector current Ic reaches the snapback point SB (FIG. 3), the current distribution of a region where an emitter current Ie mainly flows has the maximum value around the center of the emitter mesa layer 25 (FIG. 1) in the longitudinal direction and extends on both sides in the longitudinal direction. When the collector current Ic increases beyond the snapback point SB, the current distribution of the region where the emitter current Ie mainly flows changes to have the maximum value at a position changed from the position around the center of the emitter mesa layer 25 (FIG. 1) in the first direction D1 because of asymmetry factors around the emitter mesa layer 25. In this specification, "asymmetry" means a factor by which the region where the emitter current Ie mainly flows has the maximum current value at a position changed from a position around the center of the emitter mesa layer 25 (FIG. 1)

in the longitudinal direction. The kink K (FIG. 3) is considered to appear as a result of the change in the position at which the region where the emitter current Ie mainly flows has the maximum current value. In embodiments to be described below, the breaking of thermal and electrical symmetries around the emitter mesa layer 25 is suppressed.

First Embodiment

Next, a semiconductor device according to the first embodiment will be described with reference to FIGS. 4 to 10.

Figure 4:
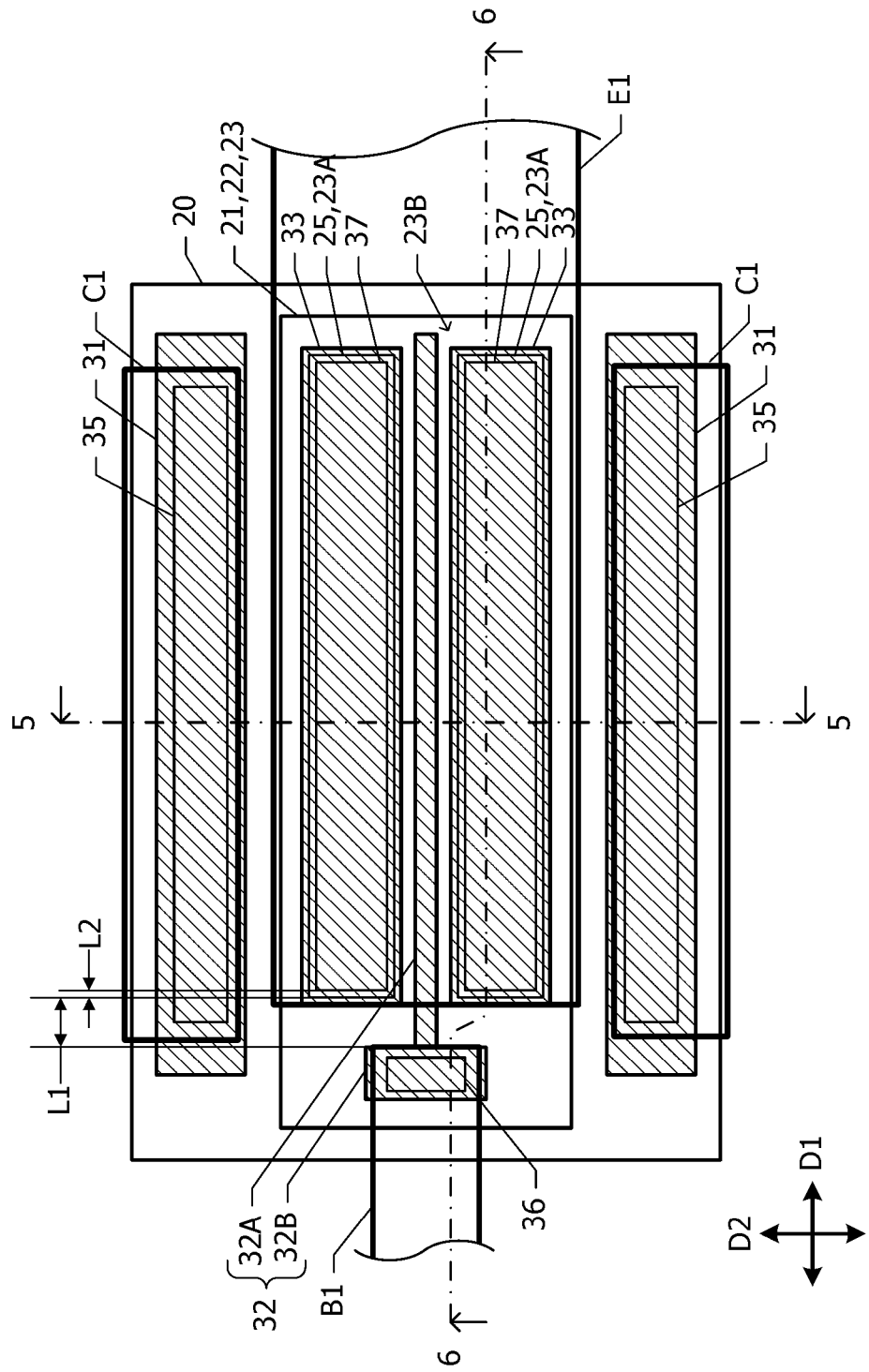
FIG. 4 is a diagram illustrating the planar layout of a plurality of components in a semiconductor device according to a first embodiment.

FIG. 4 is a diagram illustrating the planar layout of a plurality of components in a semiconductor device according to the first embodiment. The difference from the HBT that is the reference example illustrated in FIG. 1 will be described below. In the reference example illustrated in FIG. 1, the spacing L2 between the edge of the emitter mesa layer 25 on the side of the base wiring line B1 and the edge of the emitter contact hole 37 on the side of the base wiring line B1 in the first direction D1 is larger than the spacing L1 between the base wiring line B1 and the emitter mesa layer 25 in the first direction D1. In contrast, in the first embodiment, the spacing L2 is smaller than the spacing L1. That is, in the first direction D1, the emitter mesa layer 25 is placed on the side of the emitter contact hole 37 from the midpoint between the edge of the emitter contact hole 37 on the side of the base wiring line B1 and the edge of the base wiring line B1.

In the reference example illustrated in FIG. 1, the end portion of the emitter mesa layer 25 on the side of the base wiring line B1 does not overlap the emitter wiring line E1. In contrast, in the first embodiment, the emitter mesa layer 25 is included in the emitter wiring line E1 in plan view. That is, in plan view, the both ends of the emitter mesa layer 25 overlap the emitter wiring line E1.

The length of the emitter mesa layer 25 (the dimension in the first direction D1) is, for example, not less than 5 µm and not greater than 60 µm (i.e., from 5 µm to 60 µm), and the width of the emitter mesa layer 25 (the dimension in the second direction D2) is, for example, not less than 1 µm and not greater than 8 µm (i.e., from 1 µm to 8 µm). The differences between the lengths and widths of the emitter electrode 33 and the emitter mesa layer 25 are less than or equal to 1 µm. That is, the spacing between the edges of the emitter electrode 33 and the emitter mesa layer 25 is less than or equal to 0.5 µm.

The emitter contact hole 37 is placed to be substantially symmetric with respect to the emitter mesa layer 25 in the first direction D1. For example, the spacing between the edge of the emitter contact hole 37 and the edge of the emitter mesa layer 25 at one end is equal to the spacing between them at the other end in the first direction D1. For example, the length of the emitter contact hole 37 is set to be not less than 4 µm and not greater than 60 µm (i.e., from 4 µm to 60 µm) and the width of the emitter contact hole 37 is set to be not less than 0.5 µm and not greater than 8 µm (i.e., from 0.5 µm to 8 µm) on the basis of the dimension of the emitter electrode 33.

The spacing between the emitter mesa layer 25 and the base electrode main portion 32A is substantially constant in the longitudinal direction (the first direction D1) and is, for example, not less than 0.5 µm and not greater than 2 µm (i.e., from 0.5 µm to 2 µm).

Figure 5:
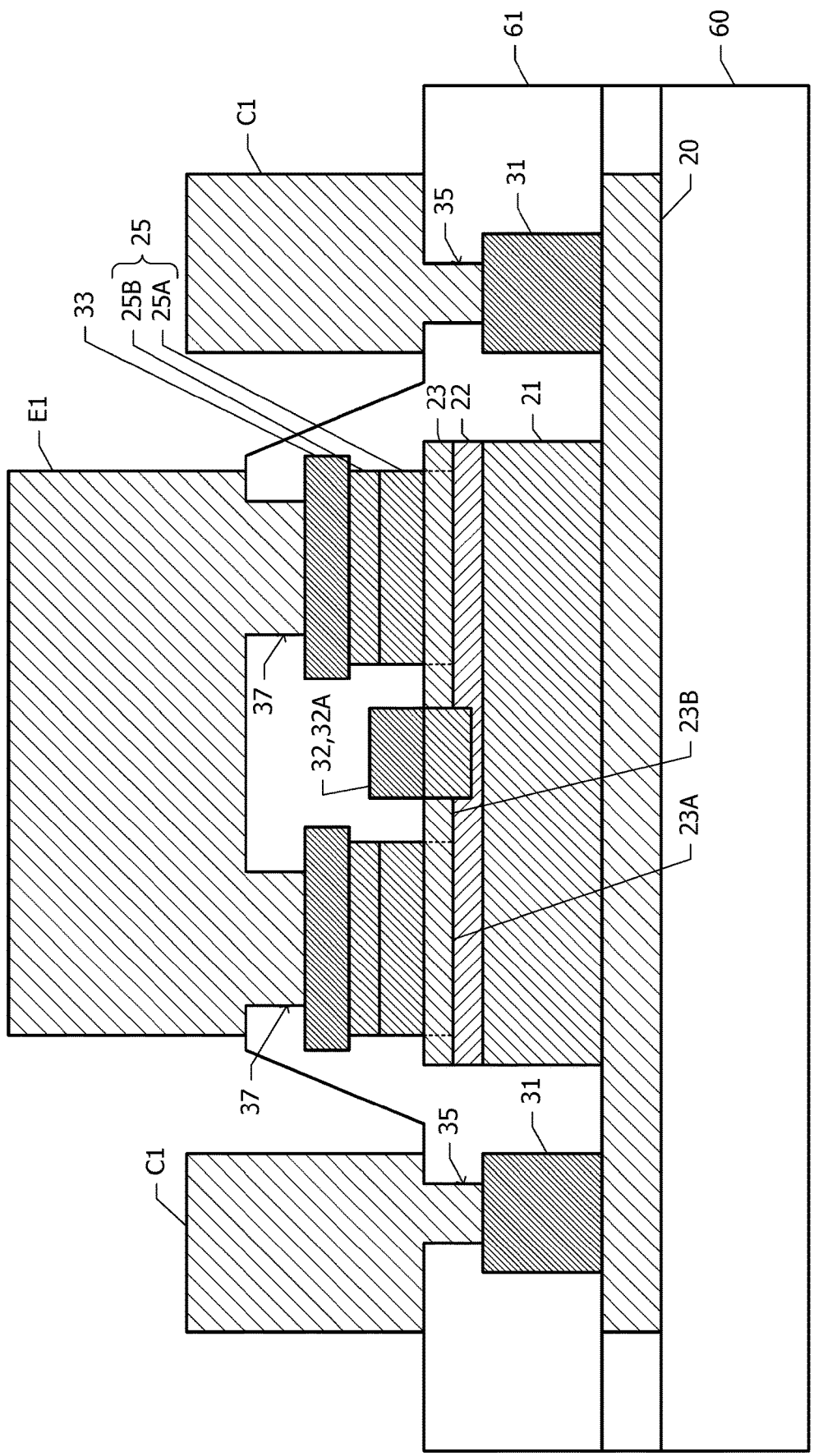
FIG. 5 is a cross-sectional view taken along dash-dotted line 5-5 in FIG. 4.

FIG. 5 is a cross-sectional view taken along dash-dotted line 5-5 in FIG. 4. An n-type GaAs layer is placed on a substrate 60 formed of semi-insulating GaAs. A part of the n-type GaAs layer is made insulating using an ion implantation technique. The non-insulating part of the n-type GaAs layer forms the sub-collector layer 20. On a partial region of the sub-collector layer 20, the collector layer 21, the base layer 22, and the emitter layer 23 are laminated. The emitter mesa layers 25 are placed on two respective regions inside the upper surface of the emitter layer 23. The emitter mesa layer 25 includes a cap layer 25A on the side of the emitter layer 23 and a contact layer 25B placed on the cap layer 25A.

The emitter layer 23 is divided into the intrinsic emitter layer 23A directly below the emitter mesa layer 25 and the ledge layer 23B that is not covered by the emitter mesa layer 25. The intrinsic emitter layer 23A substantially overlaps the emitter mesa layer 25 in plan view, and an operating current mainly flows through the intrinsic emitter layer 23A.

The collector layer 21 is formed of n-type GaAs. The base layer 22 is formed of p-type GaAs. A sheet resistance ρs of the base layer 22 is, for example, not less than 130 Ω/sq. and not greater than 300 Ω/sq. (i.e., from 130 Ω/sq. to 300 Ω/sq.). The emitter layer 23 is formed of, for example, n-type InGaP having an Si doping concentration of not less than $2\times10^{17}$ cm$^{-3}$ and not greater than $5\times10^{17}$ cm$^{-3}$ (i.e., from $2\times10^{17}$ cm$^{-3}$ to $5\times10^{17}$ cm$^{-3}$) and has a thickness of not less than 20 nm and not greater than 50 nm (i.e., from 20 nm to 50 nm). The cap layer 25A is formed of, for example, n-type GaAs having an Si doping concentration of not less than $2\times10^{18}$ cm$^{-3}$ and not greater than $4\times10^{18}$ cm$^{3}$ (i.e., from $2\times10^{18}$ cm$^{-3}$ to $4\times10^{18}$ cm$^{-3}$) and has a thickness of not less than 50 nm and not greater than 200 nm (i.e., from 50 nm to 200 nm). The contact layer 25B is formed of, for example, n-type InGaAs having an Si doping concentration of not less than $1\times10^{19}$ cm$^{-3}$ and not greater than $3\times10^{19}$ cm$^{-3}$ (i.e., from $1\times10^{19}$ cm$^{-3}$ to $3\times10^{19}$ cm$^{3}$) and has a thickness of not less than 100 nm and not greater than 200 nm (i.e., from 100 nm to 200 nm). These semiconductor layers may be formed of other compound semiconductors.

The collector electrode 31 is placed on the sub-collector layer 20. The collector electrodes 31 are placed on both sides of the collector layer 21 in the cross section illustrated in FIG. 5. The base electrode 32 placed on the ledge layer 23B is connected to the base layer 22 via an alloy layer penetrating the ledge layer 23B. The alloy layer is formed in such a manner that the material of the base electrode 32 is diffused in the ledge layer 23B through a heat treatment process and is alloyed. In the cross section illustrated in FIG. 5, the base electrode main portion 32A (FIG. 4) in the base electrode 32 appears and is placed between the two emitter mesa layers 25. On the respective emitter mesa layers 25, the emitter electrodes 33 are placed.

The emitter electrode 33 outwardly protrudes from the edge of the emitter mesa layer 25 like an overhang. That is, the edge of the emitter mesa layer 25 is set back from the edge of the emitter electrode 33. This structure is formed through, for example, a self-aligning process in which the emitter electrode 33 is used as an etching mask and the unnecessary portion of a semiconductor layer forming the emitter mesa layer 25 is etched.

An insulating film 61 is placed to cover the collector electrode 31, the base electrode 32, and the emitter electrode 33. On the insulating film 61, the emitter wiring line E1 and the collector wiring line C1 in the first layer are placed. The emitter wiring line E1 is connected to the two emitter electrodes 33 via the two emitter contact holes 37 provided in the insulating film 61. That is, the two emitter electrodes 33 are interconnected by the emitter wiring line E1. The collector wiring line C1 is provided for each collector electrode 31 and is connected to the collector electrode 31 via the collector contact hole 35 provided in the insulating film 61.

Figure 6:
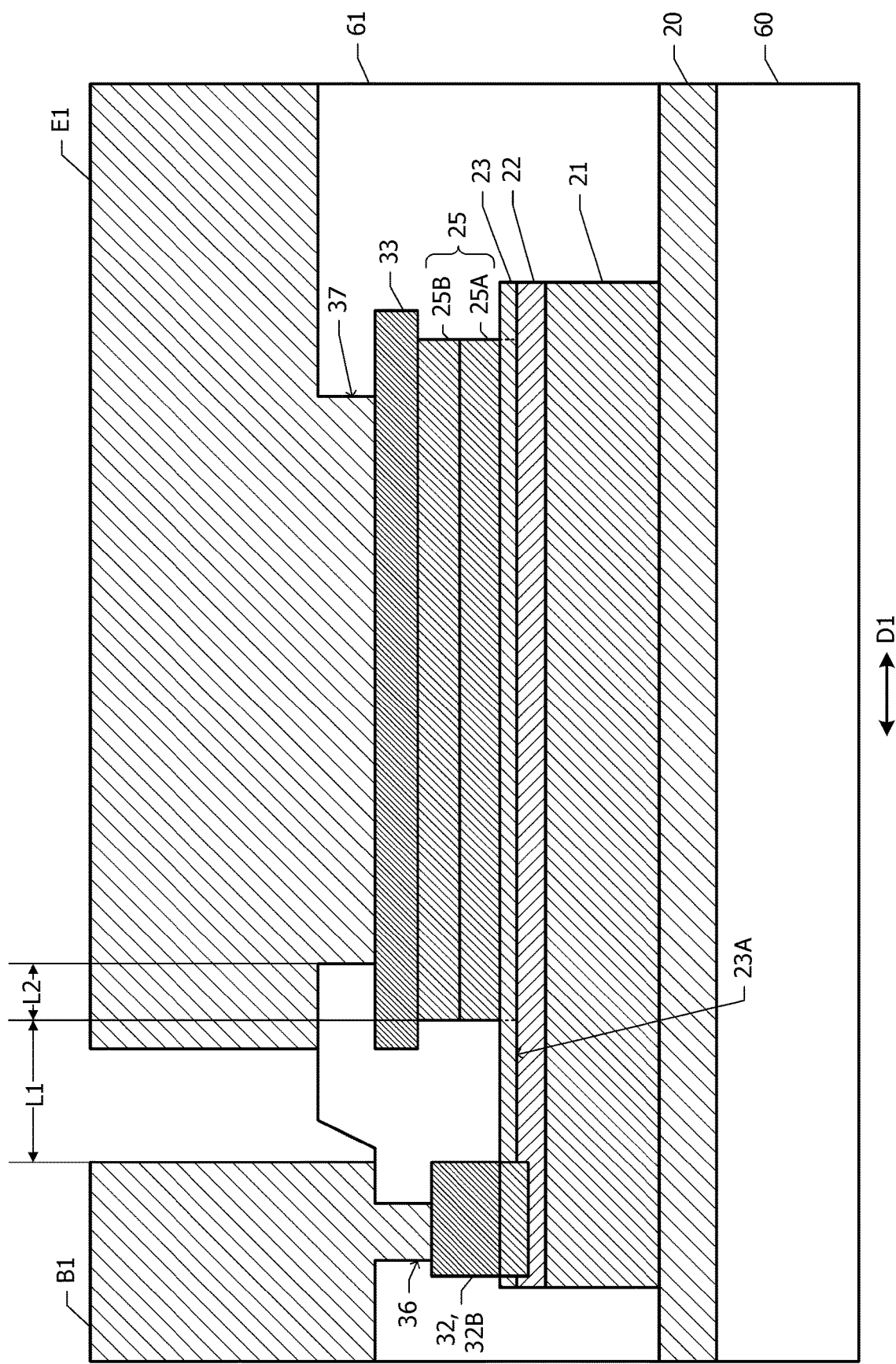
FIG. 6 is a cross-sectional view taken along dash-dotted line 6-6 in FIG. 4.

FIG. 6 is a cross-sectional view taken along dash-dotted line 6-6 in FIG. 4. The descriptions of the components illustrated in the cross section in FIG. 5 will be omitted below.

In the cross section illustrated in FIG. 6, the base electrode pad portion 32B in the base electrode 32 appears. On the insulating film 61 covering the base electrode 32 and the emitter electrode 33, the base wiring line B1 and the emitter wiring line E1 in the first layer are placed. The base wiring line B1 is connected to the base electrode pad portion 32B via the base contact hole 36 provided in the insulating film 61. The base wiring line B1 and the emitter wiring line E1 are placed in the same wiring line layer, and the spacing between them is designed to be, for example, the minimum spacing determined on the basis of the design rule of a layer where the base wiring line B1 and the emitter wiring line E1 are placed. The base wiring line B1 and the emitter wiring line E1 extend on opposite sides in the first direction D1.

The spacing L2 between the edge of the emitter mesa layer 25 on the side of the base wiring line B1 and the edge of the emitter contact hole 37 on the side of the base wiring line B1 in the first direction D1 is smaller than the spacing L1 between the edge of the base wiring line B1 and the edge of the emitter mesa layer 25 in the first direction D1.

Figure 7:
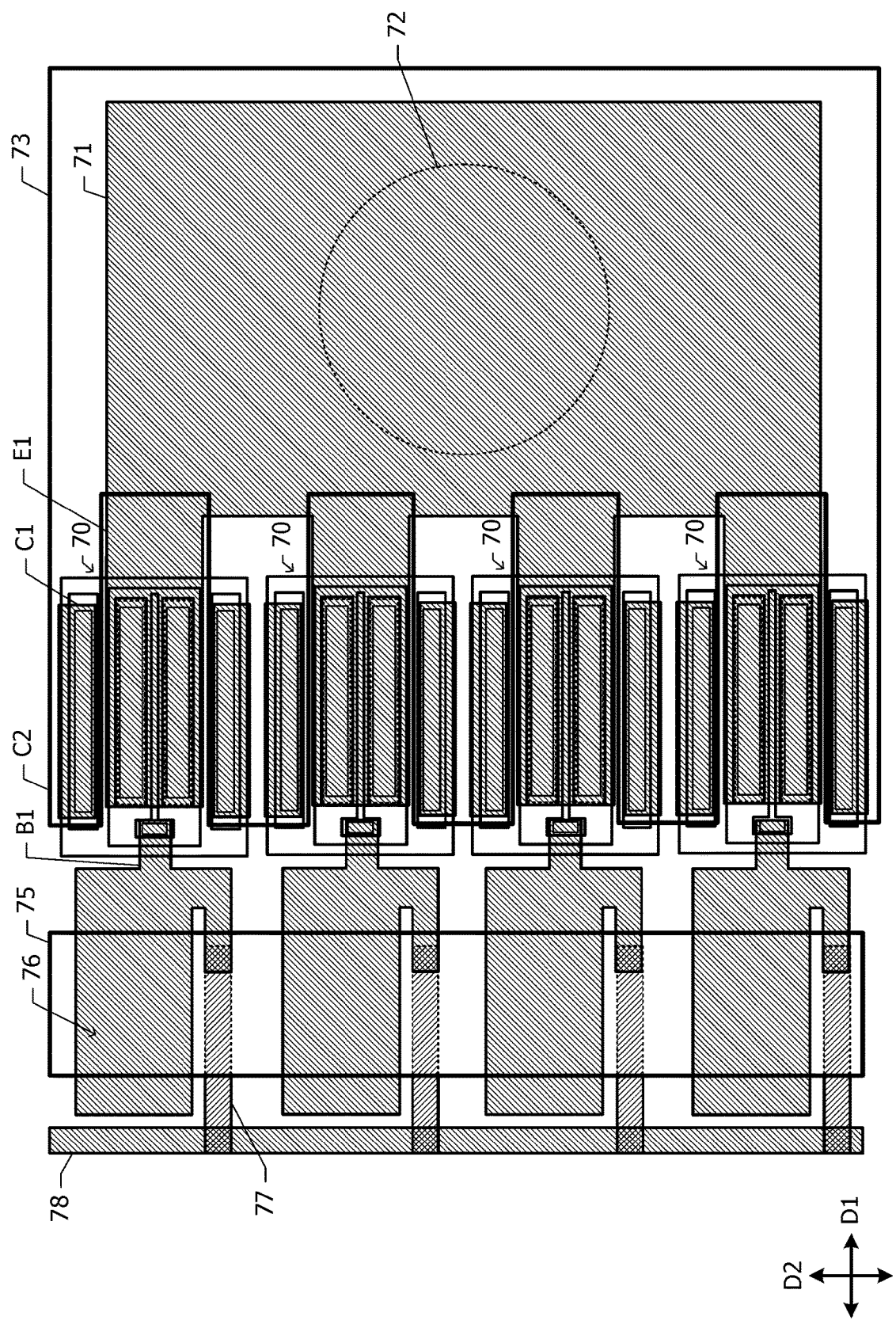
FIG. 7 is a plan view of a semiconductor device according to the first embodiment.

FIG. 7 is a plan view of a semiconductor device according to the first embodiment. Referring to FIG. 7, wiring patterns at the first wiring line layer are hatched. A semiconductor device according to the first embodiment includes a plurality of unit transistors 70. Each of the unit transistors 70 has the same structure as the semiconductor device illustrated in FIGS. 4, 5, and 6. The unit transistors 70 are arranged in a direction (the second direction D2) orthogonal to the longitudinal direction (the first direction D1) of the emitter mesa layer 25 (FIG. 4).

The first-layer emitter wiring line E1 extends from each of the unit transistors 70 toward one side (the right-hand side in FIG. 7) in the first direction. The emitter wiring lines E1 extending from the respective unit transistors 70 are continuous with an emitter common wiring line (ground wiring line) 71. A via hole 72 is formed in the emitter common wiring line 71 in plan view. The via hole 72 extends through the substrate 60 (FIGS. 5 and 6) and reaches the back surface of the substrate 60. The emitter common wiring line 71 is connected to a ground electrode for external connection provided on the back surface of the substrate 60 via a metal member placed in the via hole 72.

The base wiring line B1 extends from each of the unit transistors 70 toward a direction (the left side in FIG. 7) opposite to the direction in which the emitter wiring line E1 extends. Each of the base wiring lines B1 is increased in width overlaps a radio-frequency input wiring line 75 placed at the second wiring line layer. The portion where each of the base wiring lines B1 overlaps the radio-frequency input wiring line 75 function as a capacitor 76 with an MIM structure (the details of this structure will be omitted). Furthermore, each of the base wiring lines B1 is connected to a bias wiring line 78 via a thin-film resistor 77. A wiring line for connection to the thin-film resistor 77 and the bias wiring line 78 are placed at the first wiring line layer. The thin-film resistor 77 is placed at a layer different from the first wiring line layer and is formed of a material different from the wiring material of the first layer.

A second-layer collector wiring line C2 is placed to overlap the first-layer collector wiring line C1 in each of the unit transistors 70 and is electrically connected to the first-layer collector wiring line C1. Each of the collector wiring lines C2 extends from the portion thereof overlapping the first-layer collector wiring line C1 in the same direction as the direction in which the emitter wiring line E1 extends and is continuous with a second-layer collector common wiring line 73.

Next, the advantageous effect of the first embodiment will be described. In the first embodiment, since the spacing L1 is larger than the spacing L2 (FIG. 4), the degree of the breaking of a symmetry around the emitter mesa layer 25 and the emitter contact hole 37 in the first direction D1 is lower than that in the reference example (FIG. 1). For example, the influence of heat that the base wiring line B1 and the base electrode pad portion 32B have upon the emitter mesa layer 25 and the emitter wiring line E1 in the emitter contact hole 37 is smaller than that in the reference example (FIG. 1). Accordingly, in the first embodiment, the kink K (FIG. 3), which occurs as a result of the breaking of a symmetry around the emitter mesa layer 25, is less likely to occur. This suppresses the reduction in the transition voltage Vt (FIG. 2) and leads to the extension of the SOA.

Heat generated at the intrinsic emitter layer 23A (FIG. 5) directly below the emitter mesa layer 25, the collector layer 21 directly below the intrinsic emitter layer 23A, and other points is transferred to the emitter electrode 33 and the emitter wiring line E1. In order to further enhance the thermal symmetry in the first direction D1, it is desirable to move the emitter mesa layer 25 away from the base wiring line B1 to allow the emitter mesa layer 25 to be included in the emitter wiring line E1 in plan view. However, if the emitter mesa layer 25 is moved away from the base wiring line B1, the base-collector junction capacitance Cbc becomes large relative to the area of the emitter mesa layer 25. This leads to the degradation in radio-frequency characteristics. It is therefore not desirable that the emitter mesa layer 25 be moved too far away from the base wiring line B1.

In order to enhance heat dissipation, it is desirable that the emitter contact hole 37 cover the most of the emitter mesa layer 25 and the emitter electrode 33 and the edges of the emitter mesa layer 25 and the emitter electrode 33 be closer to the corresponding edge of the emitter contact hole 37. For example, it is desirable that the spacing between the edge of the emitter mesa layer 25 on the side of the base wiring line B1 and the edge of the emitter contact hole 37 on the side of the base wiring line B1 be smaller than the spacing between the emitter mesa layer 25 and the base electrode pad portion 32B in the first direction D1.

For example, the spacing between the base wiring line B1 and the emitter wiring line E1 may be set to the minimum spacing in the design rule of the first wiring line layer and the edge of the emitter electrode 33 on the side of the base wiring line B1 be made to coincide with the edge of the emitter wiring line E1. The "coincidence" includes the case where an acceptable alignment error, which may occur in a semiconductor process, occurs. By arranging the base wiring line B1, the emitter wiring line E1, and the emitter electrode 33 as above, the increase in the base-collector junction capacitance Cbc can be suppressed and the degradation in radio-frequency characteristics can be suppressed.

In order to reduce the base-collector junction capacitance Cbc relative to an emitter-base junction capacitance Ceb, it is desirable that the emitter mesa layer 25 be as large as possible inside the collector layer 21 and the base layer 22 in plan view. It is therefore desirable that the edge of the emitter mesa layer 25 be as close as possible to the base electrode 32. For example, it is desirable that the minimum value of the spacing between the base electrode 32 and the emitter mesa layer 25 be less than the value of the spacing between the edge of the base wiring line B1 on the side of the emitter wiring line E1 and the edge of the emitter wiring line E1 on the side of the base wiring line B1.

In order to confirm that the SOA can be extended according to the first embodiment, samples were actually prepared and SOA measurement was performed. This evaluation experiment will be described below with reference to FIGS. 8 and 9.

Figure 8:
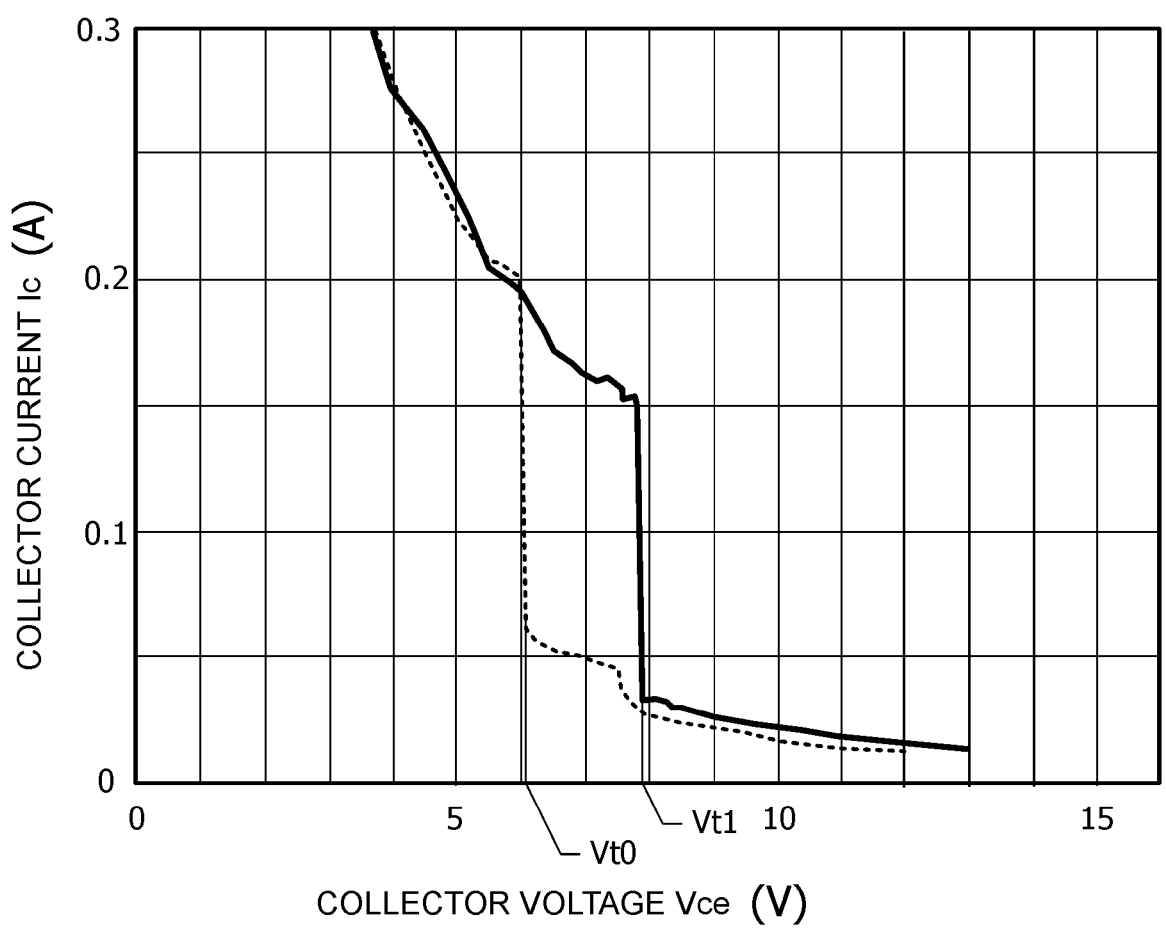
FIG. 8 is a graph representing an actual measurement result of an SOA line of a semiconductor device according to the first embodiment.

FIG. 8 is a graph representing an actual measurement result of an SOA line of a semiconductor device according to the first embodiment. The horizontal axis represents the collector voltage Vce in units of "V", and the vertical axis represents the collector current Ic in units of "A". Referring to FIG. 8, a solid line represents the SOA line of a semiconductor device according to the first embodiment and a broken line represents the SOA line of a semiconductor device that is a reference example (FIG. 1). In a semiconductor device according to the first embodiment having the characteristics illustrated in FIG. 8, the width and length of the emitter mesa layer 25 are 3 µm and 40 µm, respectively.

The graph indicates that the transition voltage Vt1 of a semiconductor device according to the first embodiment is higher than a transition voltage Vt0 of a semiconductor device that is a reference example by approximately 1.8 V.

A plurality of samples in which the spacings L1 (FIG. 4) between the emitter mesa layer 25 and the base wiring line B1 in the first direction D1 differ from one another were prepared and the transition voltages Vt of the respective samples were measured. In the respective samples, the spacing L2 (FIG. 4) between the edge of the emitter mesa layer 25 on the side of the base wiring line B1 and the edge of the emitter contact hole 37 on the side of the base wiring line B1 was also changed in accordance with the spacing L1.

Figure 9:
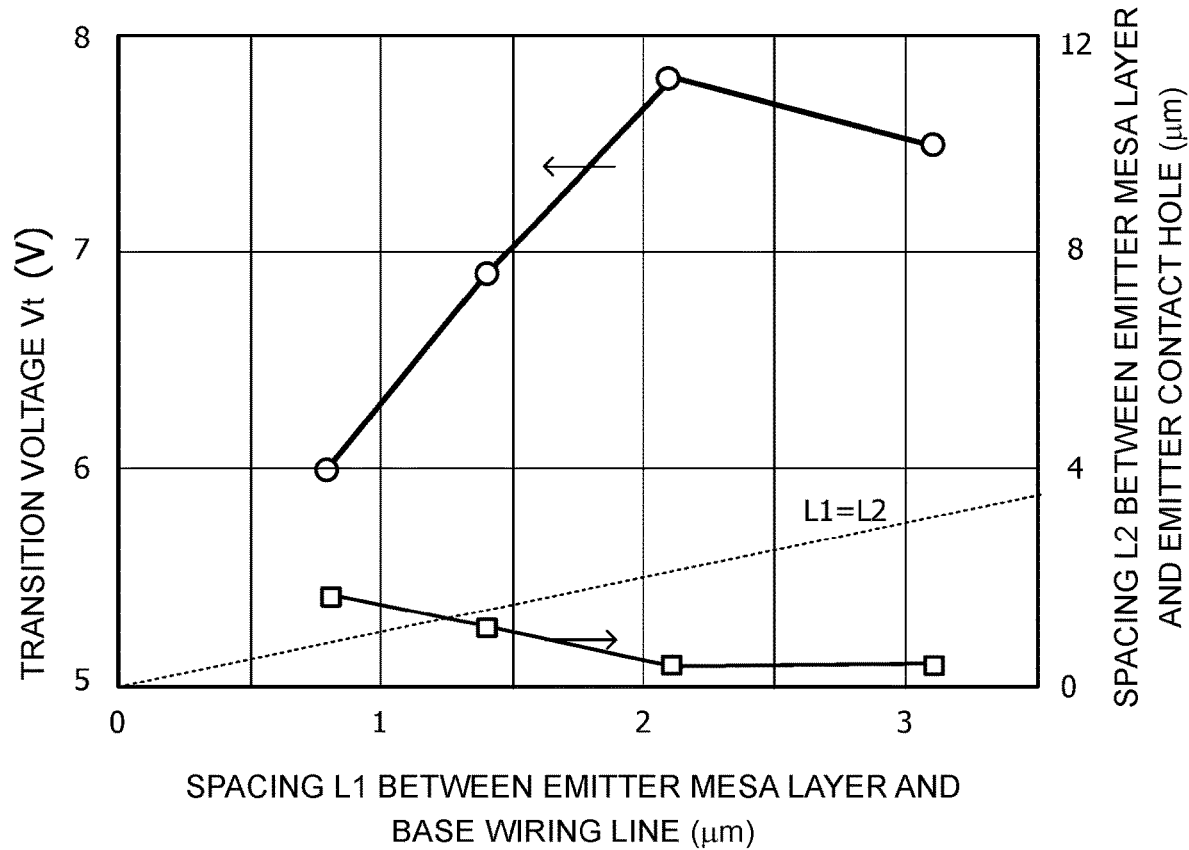
FIG. 9 is a graph representing measurement results of a transition voltage Vt when spacings L1 and L2 are changed.

FIG. 9 is a graph representing measurement results of the transition voltage Vt when the spacings L1 and L2 are changed. The horizontal axis represents the spacing L1 in units of "µm", the left-side vertical axis represents the transition voltage Vt in units of "V", and the right-side vertical axis represents the spacing L2 in units of "µm". In the graph illustrated in FIG. 9, the circles represent the transition voltage Vt and the squares represent the spacing L2. The broken line in the graph represents a position where the relationship of L1=L2 is satisfied.

When the spacing L1 is smaller than a design spacing (constant) between the base wiring line B1 and the emitter wiring line E1, the left-side edge of the emitter wiring line E1 needs to be placed on the right side of the left-side edge of the emitter mesa layer 25 to ensure the design spacing between the emitter wiring line E1 and the base wiring line B1 in FIG. 6. When the spacing L1 is reduced in this conditions, the spacing L2 needs to be increased to ensure a margin of alignment between the edge of the emitter wiring line E1 and the edge of the emitter contact hole 37. The reason why the spacing L2 is increased with the decrease in the spacing L1 in the range in which the spacing L1 is less than or equal to 2 µm is that this alignment margin needs to be ensured.

The graph indicates that the transition voltage Vt is the maximum around the spacing L1 of 2 µm. Around this point, the spacing L1 is larger than the spacing L2. The graph indicates that when the spacing L1 is larger than or equal to the spacing L2, the transition voltage Vt is higher than that when the spacing L1 is smaller than the spacing L2. In a range in which the spacing L2 is greater than 2 µm, the increase in the transition voltage Vt does not occur even if the spacing L2 is increased. The increase in the spacing L1 becomes a factor by which the area of a base-collector junction interface is increased and radio-frequency characteristics are degraded. Accordingly, it is not desirable that the spacing L1 be increased more than necessary. The result of the evaluation experiment in FIG. 9 indicates that the spacing L1 is preferably not less than 1.5 µm and not greater than 3 µm (i.e., from 1.5 µm to 3 µm).

Next, a description will be made of the reason why the above-described result of the evaluation experiment is obtained. In the range in which the spacing L1 is less than 2 µm, for example, the end portion of the emitter mesa layer 25 on the side of the base wiring line B1 extends to the outside of the emitter wiring line E1 as illustrated in FIG. 1. The region of the end portion of the emitter mesa layer 25 on the side of the base wiring line B1 which does not overlap the emitter wiring line E1 becomes narrower with the increase in the spacing L1. Since the spacing L2 decreases with the increase in the spacing L1, the region of the emitter mesa layer 25 which is located outside the emitter contact hole 37 becomes narrow. Accordingly, heat is easily externally dissipated from the emitter mesa layer 25 via the insulating film 61 (FIG. 6) below the emitter wiring line E1 and the emitter wiring line E1 in the emitter contact hole 37. As a result, the temperature near the end portion of the emitter mesa layer 25 decreases and thermal asymmetry is suppressed.

Furthermore, since the increase in the spacing L1 is equivalent to the movement of the base electrode pad portion 32B away from the emitter mesa layer 25, electrical asymmetry is suppressed as compared with the electrical asymmetry at the end portion of the emitter mesa layer 25 opposite to the base electrode pad portion 32B.

Thus, the increase in the spacing L1 leads to the suppression of thermal and electrical asymmetries with respect to the emitter mesa layer 25. As a result, the kink K (FIG. 3) is less likely to occur and the SOA can be extended.

In the range in which the spacing L1 is greater than or equal to approximately 2 µm, the spacing L2 is determined on the basis of the margin of alignment between the emitter contact hole 37 and each of the emitter electrode 33 and the emitter wiring line E1 and is independent of the spacing L1. The spacing L2 is therefore constant. When the spacing L1 increases, the base electrode pad portion 32B is moved away from the emitter mesa layer 25 and the heat dissipation path from the emitter mesa layer 25 to the base wiring line B1 is lost. In contrast, at the opposite end portion of the emitter mesa layer 25, the heat dissipation path from the emitter mesa layer 25 to the emitter wiring line E1 is ensured. As a result, the degree of the thermal asymmetry with respect to the emitter mesa layer 25 increases and the kink K (FIG. 3) easily occurs. Accordingly, it is considered that in a range in which the spacing L2 is greater than 2 µm, the transition voltage Vt decreases with the increase in the spacing L1.

As described above, when the spacing L1 is increased, the thermal and electrical asymmetries are suppressed first and then the degree of the thermal asymmetry increases. It is estimated that at a point where the balance between the suppression of the thermal and electrical asymmetries and the increase in the thermal asymmetry is achieved, the maximum value of the transition voltage Vt is obtained.

Figure 10:
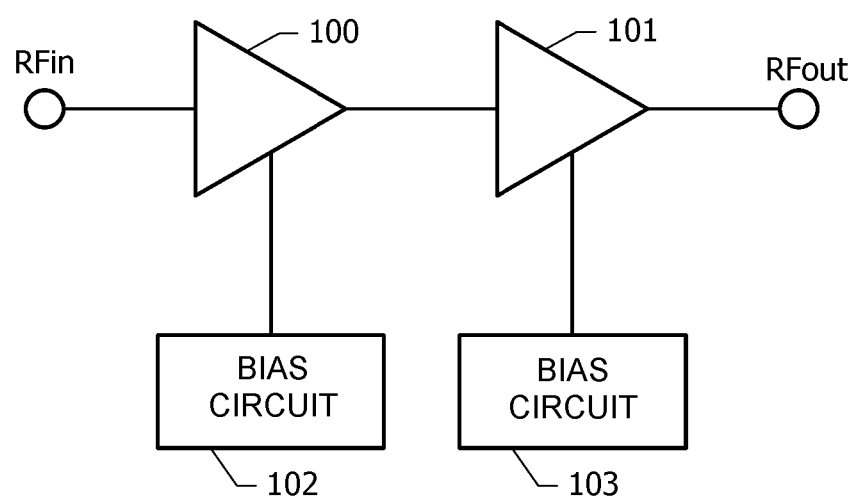
FIG. 10 is a block diagram of a power amplifier monolithic microwave integrated circuit (MMIC) element in which semiconductor devices according to the first embodiment are used.

FIG. 10 is a block diagram of a power amplifier monolithic microwave integrated circuit (MMIC) element in which semiconductor devices according to the first embodiment are used. An MMIC includes a driver-stage amplifier 100, a power-stage amplifier 101, and bias circuits 102 and 103. The bias circuits 102 and 103 supply bias currents to the driver-stage amplifier 100 and the power-stage amplifier 101, respectively. A radio-frequency input signal RFin is input into the driver-stage amplifier 100. A signal amplified by the driver-stage amplifier 100 is input into the power-stage amplifier 101. A radio-frequency output signal RFout amplified by the power-stage amplifier 101 is output to the outside of the MMIC.

Each of the driver-stage amplifier 100 and the power-stage amplifier 101 is formed of a plurality of HBTs connected in parallel with each other. The number of HBTs in the power-stage amplifier 101 is larger than that in the driver-stage amplifier 100. The HBTs in the driver-stage amplifier 100 and the HBTs in the power-stage amplifier 101 are formed on the common substrate 60 (FIGS. 5 and 6) as a single semiconductor chip using a common semiconductor process.

Next, advantageous effects obtained by employing the structure illustrated in FIG. 10 will be described. By optionally selecting the spacings L1 and L2 (FIG. 4), a plurality of HBTs having the different transition voltages Vt can be formed in the same semiconductor chip.

HBTs according to the first embodiment may be used in the power-stage amplifier 101 that needs to have a high withstand voltage. HBTs in which the spacing L1 is less than 1.5 μm may be used in the driver-stage amplifier 100 that does not need to have a high withstand voltage but needs to have a high gain. The HBT in which the spacing L1 is less than 1.5 μm can ensure the sufficient gain of the driver-stage amplifier 100 because the base-collector junction capacitance Cbc can be reduced.

Thus, by increasing the gain of the driver-stage amplifier 100 that does not need to have a high withstand voltage and causing the power-stage amplifier 101 to have a high withstand voltage, a power amplifier can be realized which has a high gain and a withstand voltage that is sufficiently high for a load change. Since an HBT suitable for the driver-stage amplifier 100 and an HBT suitable for the power-stage amplifier 101 can be manufactured on a single chip using a common semiconductor process, cost reduction can be achieved as compared with the case where these HBTs are manufactured using respective dedicated processes.

Next, a modification of the first embodiment will be described. If a load change test is conducted upon an amplification circuit including a plurality of HBTs connected in parallel with each other, there may be a case where only some of the HBTs are damaged. If HBTs in a plurality of samples susceptible to damages are fixed, only the HBTs susceptible to damages may be the HBTs according to the first embodiment and the other HBTs may be, for example, the HBTs that are the reference examples illustrated in FIG. 1.

By preparing a plurality of evaluation samples in which all HBTs are the reference examples illustrated in FIG. 1 and conducting a load change test upon the evaluation samples, an HBT susceptible to a damage can be specified. By using the HBTs that are the reference examples illustrated in FIG. 1 for HBTs that are less susceptible to damages, the degradation in radio-frequency characteristics can be suppressed.

Although HBTs each having a heterojunction between GaAs and InGaP at the interface of the junction between a base layer and an emitter layer have been described in the first embodiment, the feature of the first embodiment is applicable to another bipolar transistor or an HBT having a heterojunction formed of semiconductor materials other than GaAs and InGaP. Examples of such an HBT include HBTs having heterojunctions between Si and SiGe, InGaAs and InGaP, GaAsAb and InGaP, GaInAsN and InGaP, and GaAs and AlGaAs.

Second Embodiment

Next, a semiconductor device according to the second embodiment will be described with reference to FIGS. 11, 12, and 13. The description of the structure common to a semiconductor device according to the first embodiment (FIGS. 4, 5, 6, and 7) will be omitted below.

Figure 11:
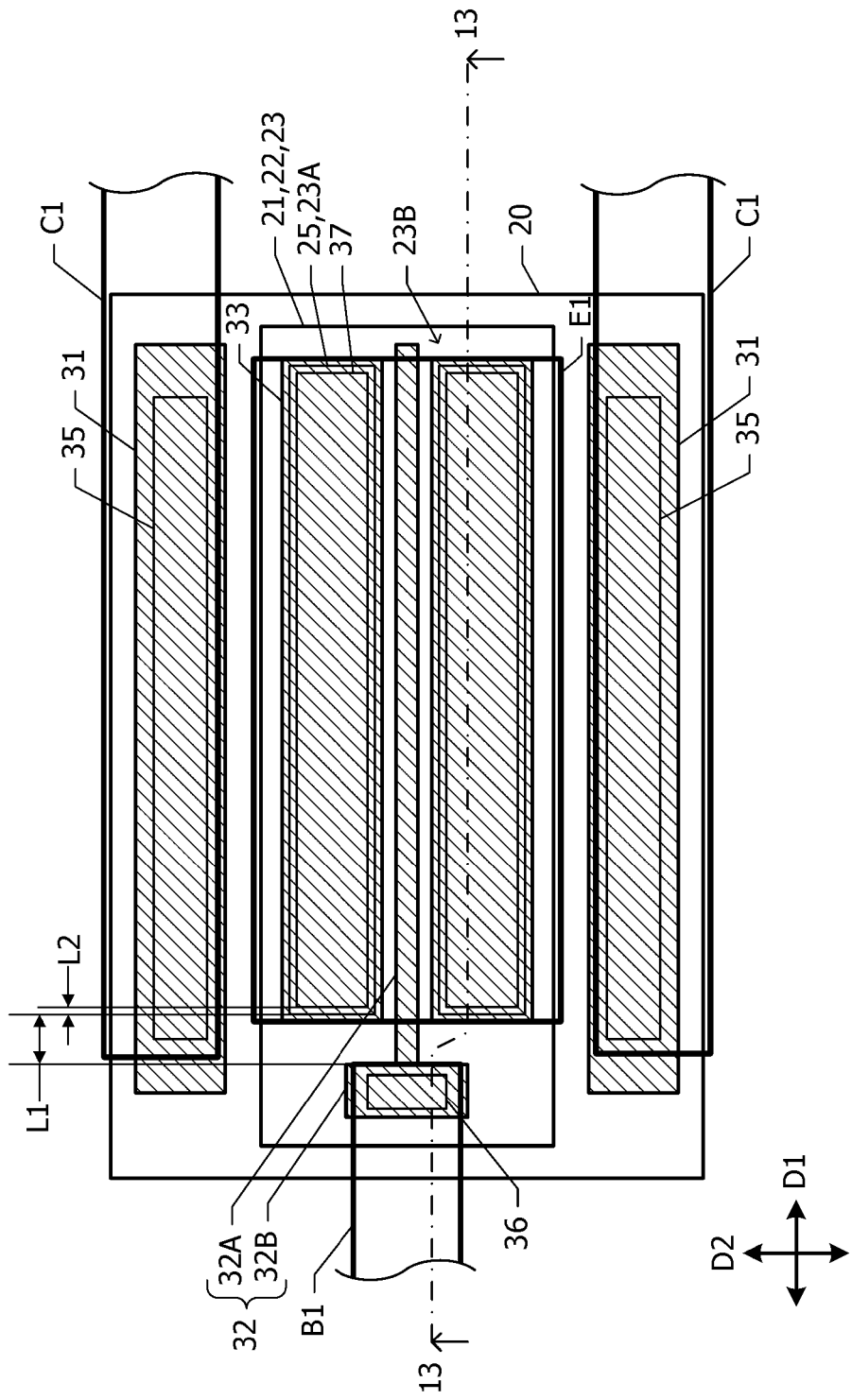
FIG. 11 is a diagram illustrating the planar layout of a plurality of components in a semiconductor device according to a second embodiment.

FIG. 11 is a diagram illustrating the planar layout of a plurality of components in a semiconductor device according to the second embodiment. In the first embodiment (FIG. 4), the first-layer emitter wiring line E1 extends from the emitter electrode 33 in the first direction D1. In the second embodiment, the first-layer emitter wiring line E1 does not extend in the first direction D1 and is included within the sub-collector layer 20. The first-layer collector wiring line C1 extends from the collector electrode 31 in the first direction D1 instead.

Figure 12:
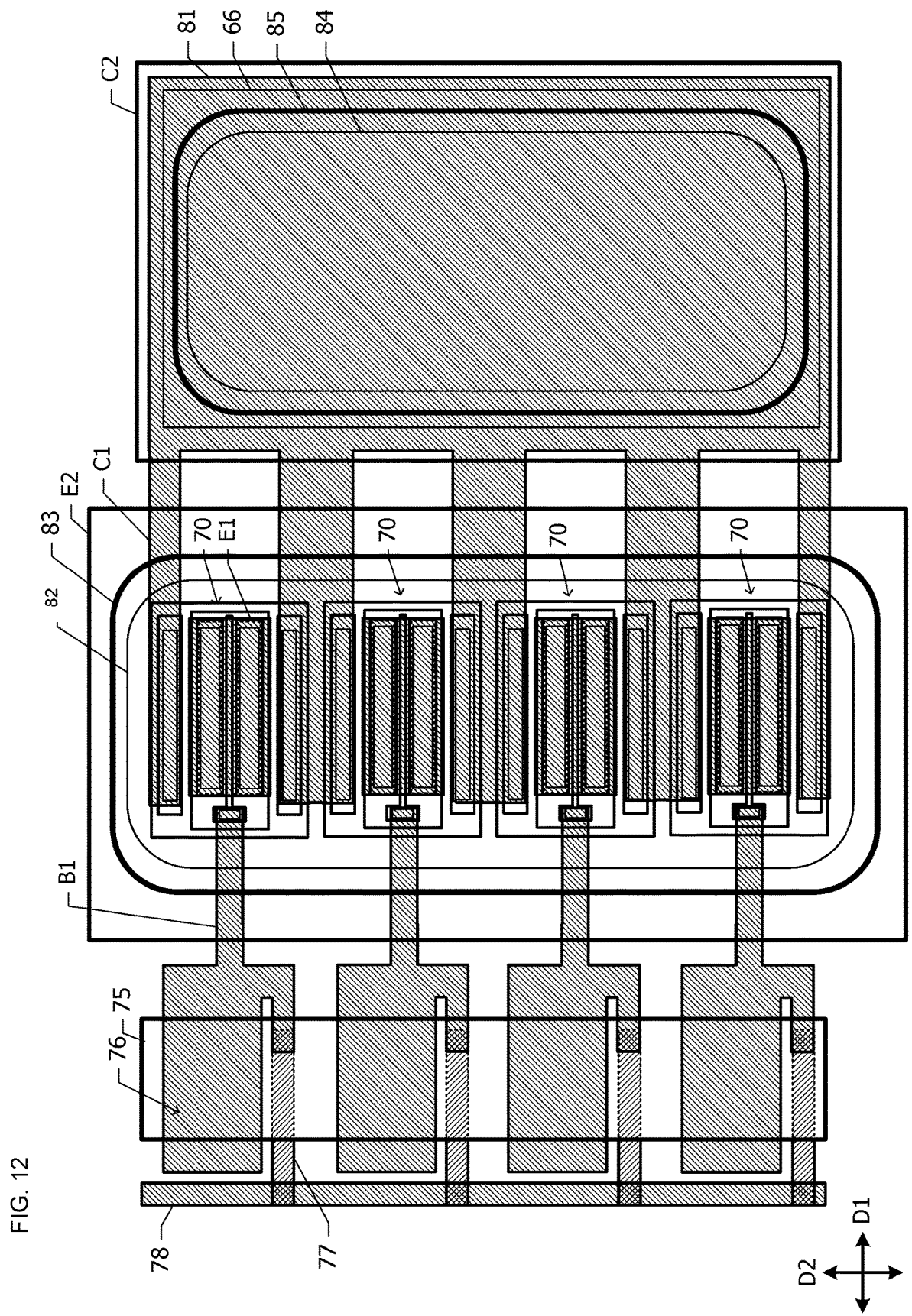
FIG. 12 is a plan view of a semiconductor device according to the second embodiment.

FIG. 12 is a plan view of a semiconductor device according to the second embodiment. FIG. 13 is a cross-sectional view taken along dash-dotted line 13-13 in FIG. 11. Referring to FIG. 12, wiring patterns at the first wiring line layer are hatched. In plan view, a second-layer emitter wiring line E2 is placed to cover the unit transistors 70. The second-layer emitter wiring line E2 is placed on an insulating film 62 (FIG. 13) covering the first-layer emitter wiring line E1 and is connected to the emitter wiring line E1 via an inter-emitter-wiring-line contact hole 65 (FIG. 13) provided in the insulating film 62. The second-layer emitter wiring line E2 interconnects the first-layer emitter wiring lines E1.

Figure 13:
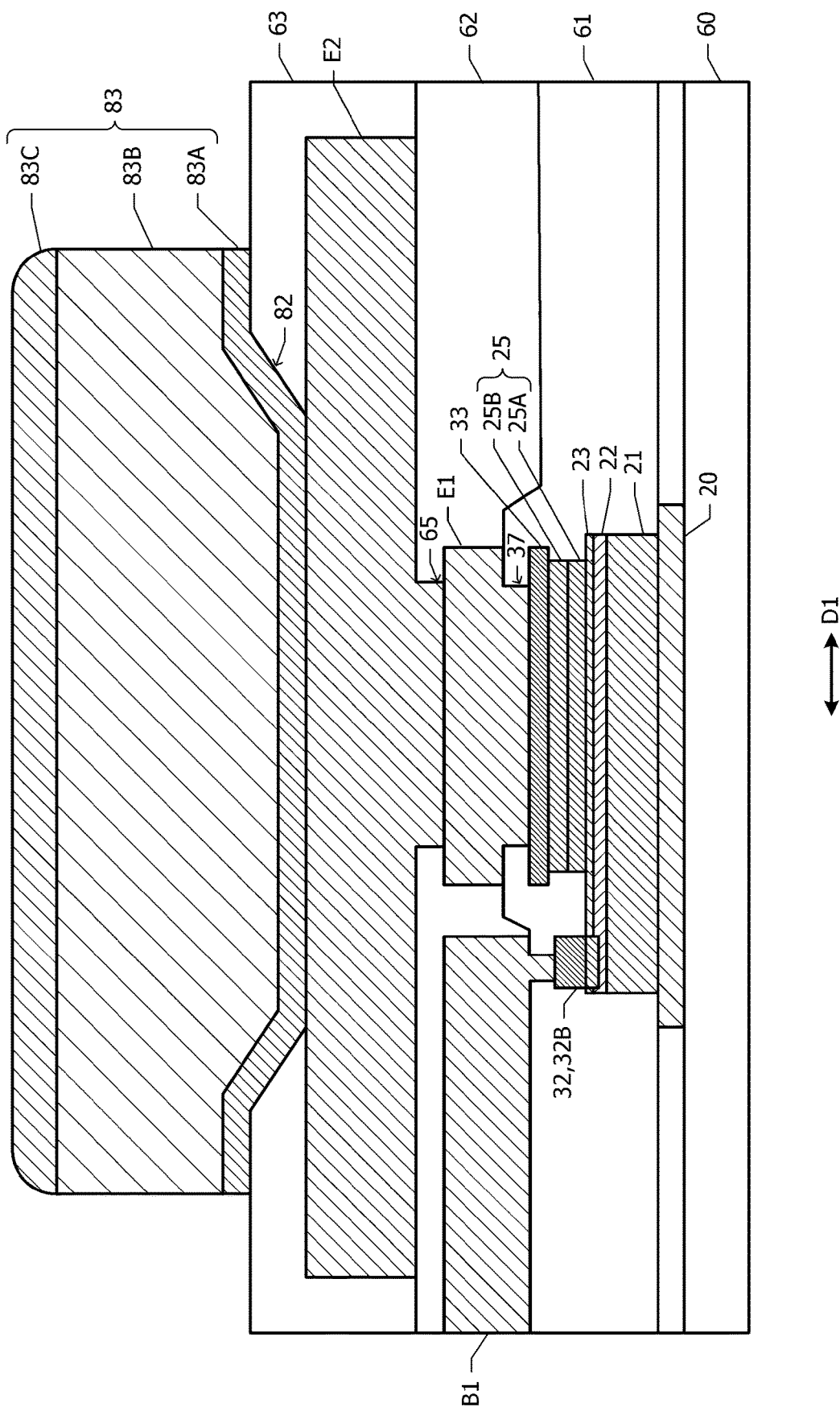
FIG. 13 is a cross-sectional view taken along dash-dotted line 13-13 in FIGS. 11 and 12.

The second-layer emitter wiring line E2 is covered with a protection film 63 (FIG. 13). On the protection film 63, an emitter bump 83 is placed. The emitter bump 83 (FIG. 13) includes an under-bump metal 83A, a pillar bump 83B on the under-bump metal 83A, and solder 83C on the pillar bump 83B. The emitter bump 83 is connected to the second-layer emitter wiring line E2 via an emitter bump-wiring line contact hole 82. In plan view, the emitter bump 83 is placed to cover the unit transistors 70.

The first-layer collector wiring lines C1 extending from the collector electrodes 31 in the first direction D1 are continuous with a collector common wiring line 81 (FIG. 12). The collector common wiring line 81 is placed apart from the second-layer emitter wiring line E2 in the first direction D1. The second-layer collector wiring line C2 is placed to partially overlap the collector common wiring line 81. The second-layer collector wiring line C2 is placed on the insulating film 62 (FIG. 13) and is connected to the collector common wiring line 81 at the first layer via an inter-wiring-line contact hole 66 (FIG. 12) provided in the insulating film 62.

A collector bump 85 is placed to partially overlap the second-layer collector wiring line C2. The collector bump 85 is placed on the protection film 63 (FIG. 13) and is connected to the second-layer collector wiring line C2 via a collector bump-wiring line contact hole 84 (FIG. 12) provided in the protection film 63. The collector bump 85 has the same layered structure as the emitter bump 83 (FIG. 13).

Next, the advantageous effect of the second embodiment will be described. In the first embodiment (FIGS. 4 an 6), the emitter mesa layer 25, the emitter electrode 33, and the emitter contact hole 37 are substantially symmetric in the first direction D1. However, since the emitter wiring line E1 extends from one side of the emitter contact hole 37 in the first direction D1, the symmetry in the first direction D1 is broken when the emitter wiring line E1 is included in these components forming the symmetry. In the second embodiment, the emitter wiring line E1 does not extend from the emitter contact hole 37 in the first direction D1. Edges at both ends of the emitter wiring line E1 in the first direction D1 substantially overlap the edges of the emitter electrode 33 in plan view. Accordingly, not only the emitter mesa layer 25, the emitter electrode 33, and the emitter contact hole 37 but also the emitter wiring line E1 is substantially symmetric in the first direction D1.

Accordingly, in the second embodiment, the kink K (FIG. 3) is much less likely to occur as compared with the first embodiment. The transition voltage Vt therefore further increases. The advantageous effect of the further extension of the SOA can be obtained. As a result, the higher withstand voltage of an HBT is realized and an operation at a higher voltage can be performed.

The emitter wiring line E2 in the inter-emitter-wiring-line contact hole 65 (FIG. 13) becomes a heat dissipation path through which heat generated at, for example, the emitter mesa layer 25 is transferred to the emitter bump 83. In order to reduce the thermal resistance of a heat dissipation path, it is desirable that the inter-emitter-wiring-line contact hole 65 be large in plan view. For example, it is desirable that the edges of the inter-emitter-wiring-line contact hole 65 on both sides be placed closer to the edges of the first-layer emitter wiring line E1 than to the center of the emitter mesa layer 25 in the first direction D1. Furthermore, it is desirable that the emitter mesa layer 25 and the inter-emitter-wiring-line contact hole 65 be substantially symmetric in the first direction D1. If this arrangement is performed, the symmetry of a heat dissipation path from the emitter mesa layer 25 to the second-layer emitter wiring line E2 is ensured. The thermal asymmetry in the first direction D1 can therefore be suppressed. As a result, the kink K (FIG. 3) is much less likely to occur and the further increase in the transition voltage Vt and the further extension of the SOA can be realized.

By adjusting the positional relationship among the emitter mesa layer 25, the emitter contact hole 37, and the edge of the emitter wiring line E1 on the side of the base wiring line B1, the transition voltage Vt can be changed in the second embodiment like in the first embodiment. Furthermore, since the positional relationship between the edge of the emitter wiring line E1 opposite to the base wiring line B1 and the inter-emitter-wiring-line contact hole 65 can be adjusted in the second embodiment, the degree of flexibility in setting the transition voltage Vt is increase as compared with the first embodiment.

By using HBTs according to the second embodiment in the power-stage amplifier 101 (FIG. 10), a power amplifier can be realized like in the first embodiment which has a high gain and a withstand voltage that is sufficiently high for a load change. Since an HBT suitable for the driver-stage amplifier 100 and an HBT suitable for the power-stage amplifier 101 can be manufactured on a single chip using a common semiconductor process, cost reduction can be achieved as compared with the case where these HBTs are manufactured using respective dedicated processes.

Third Embodiment

Next, a semiconductor device according to the third embodiment will be described with reference to FIG. 14.

The description of the structure common to a semiconductor device according to the first embodiment (FIGS. 4, 5, 6, and 7) will be omitted below.

FIG. 14 is a diagram illustrating the planar layout of a plurality of components in a semiconductor device according to the third embodiment. The single base electrode main portion 32A is placed between the two emitter mesa layers 25 in the first embodiment (FIG. 4). In the third embodiment, the base electrode main portions 32A are placed on both sides of the emitter mesa layer 25 in the second direction D2 in the third embodiment. The base electrode pad portion 32B connects the end portions of the two base electrode main portions 32A.

Also in the third embodiment, the spacing L1 between the base wiring line B1 and the emitter mesa layer 25 and the spacing L2 between the edge of the emitter mesa layer 25 on the side of the base wiring line B1 and the edge of the emitter contact hole 37 on the side of the base wiring line B1 can be defined. Also in the third embodiment, it is desirable that the spacing L2 be smaller than the spacing L1 like in the first embodiment.

The embodiments described above are illustrative, and, needless to say, a partial replacement or combination of configurations described in different embodiments is possible. The same or similar operational effects achieved by the same or similar configurations in a plurality of embodiments are not mentioned in each of the embodiments. Furthermore, the present disclosure is not limited to the embodiments described above. For example, it is obvious for those skilled in the art that various changes, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A semiconductor device comprising:
a collector layer, a base layer, an emitter layer, and an emitter mesa layer which are placed above a substrate, the emitter mesa layer being placed on a partial region of the emitter layer in plan view and having a shape that is long in a first direction in plan view;
a base electrode that is placed in a region not overlapping the emitter mesa layer in plan view, is configured to flow a base current through the base layer, and is spaced from the emitter mesa layer in a second direction orthogonal to the first direction;
an emitter electrode that is placed on the emitter mesa layer and configured to flow an emitter current through the emitter mesa layer;
an insulating film that is placed on the emitter electrode and includes an emitter contact hole included within the emitter electrode in plan view;
an emitter wiring line that is placed on the insulating film and is connected to the emitter electrode via the emitter contact hole; and
wherein
an arrangement among an edge of the emitter electrode, an edge of the emitter contact hole and an edge of the emitter wiring line on one side in the first direction is substantially symmetrical to an arrangement among an edge of the emitter electrode, an edge of the emitter contact hole and an edge of the emitter wiring line on the other side in the first direction; and on the one side in the first direction, a spacing between the edge of the emitter wiring line and the edge of the emitter electrode is smaller than a spacing between the edge of the emitter wiring line and the edge of the emitter contact hole.

2. The semiconductor device according to claim 1, wherein
on the one side in the first direction, the edge of the emitter wiring line is farther than the edge of the emitter electrode from the edge of the emitter contact hole.

3. The semiconductor device according to claim 1, wherein
on the one side in the first direction, the spacing between the edge of the emitter electrode and the edge of the emitter contact hole is less than or equal to 0.5 µm.

4. The semiconductor device according to claim 1, further comprising:
an insulating protection film that is placed above the emitter wiring line and includes a bump-wiring line contact hole within which the emitter wiring line is included in plan view; and
a bump that is placed on the protection film and is electrically connected to the emitter wiring line via the bump-wiring line contact hole.

5. A semiconductor device comprising:
at least one first bipolar transistor that is provided at a substrate and configured as a driver-stage amplifier;
at least one second bipolar transistor that is provided at a substrate and configured as a power-stage amplifier;
an insulating film covering the first bipolar transistor and the second bipolar transistor;
a first emitter wiring line and a first base wiring line which are placed on the insulating film and are connected to the first bipolar transistor; and
a second emitter wiring line and a second base wiring line which are placed on the insulating film and are connected to the second bipolar transistor,
each of the first bipolar transistor and the second bipolar transistor including
a collector layer, a base layer, an emitter layer, and an emitter mesa layer which are placed above the substrate, the emitter mesa layer being placed on a partial region of the emitter layer and having a shape that is long in a first direction in plan view,
a base electrode that is placed in a region not overlapping the emitter mesa layer in plan view, configured to flow a base current through the base layer, is spaced from the emitter mesa layer in a second direction orthogonal to the first direction, and
an emitter electrode that is placed on the emitter mesa layer and configured to flow an emitter current through the emitter mesa layer,
wherein
the insulating film includes an emitter contact hole included within the emitter electrode in each of the first bipolar transistor and the second bipolar transistor in plan view,
the first emitter wiring line is connected to the emitter electrode in the first bipolar transistor via the emitter contact hole,
the second emitter wiring line is connected to the emitter electrode in the second bipolar transistor via the emitter contact hole,
in the second bipolar transistor, an arrangement among an edge of the emitter electrode, an edge of the emitter contact hole and an edge of the second emitter wiring line on one side in the first direction is substantially symmetrical to an arrangement among an edge of the emitter electrode, an edge of the emitter contact hole and an edge of the second emitter wiring line on the other side in the first direction, and
on the one side in the first direction, a spacing between the edge of the second emitter wiring line and the edge of the emitter electrode in the second bipolar transistor is smaller than a spacing between the edge of the second emitter wiring line and the edge of the emitter contact hole in the second bipolar transistor.

6. The semiconductor device according to claim 5, wherein
in the first bipolar transistor, an arrangement among an edge of the emitter electrode, an edge of the emitter contact hole and an edge of the first emitter wiring line on one side in the first direction is not symmetrical to an arrangement among an edge of the emitter electrode, an edge of the emitter contact hole and an edge of the first emitter wiring line on the other side in the first direction.

7. The semiconductor device according to claim 5, wherein
on the one side in the first direction, the edge of the second emitter wiring line is farther than the edge of the emitter electrode in the second bipolar transistor from the edge of the emitter contact hole in the second bipolar transistor.

8. The semiconductor device according to claim 5, wherein
on the one side in the first direction, the spacing between the edge of the emitter electrode and the edge of the emitter contact hole in the second bipolar transistor is less than or equal to 0.5 µm.

9. The semiconductor device according to claim 5, further comprising:
an insulating protection film that is placed above the second emitter wiring line and includes a bump-wiring line contact hole within which the second emitter wiring line is included in plan view; and
a bump that is placed on the protection film and is electrically connected to the second emitter wiring line via the bump-wiring line contact hole.

10. A semiconductor device comprising:
at least one first bipolar transistor that is provided at a substrate and configured as a driver- stage amplifier;
at least one second bipolar transistor that is provided at a substrate and configured as a power-stage amplifier;
an insulating film covering the first bipolar transistor and the second bipolar transistor;
a first emitter wiring line and a first base wiring line which are placed on the insulating film and are connected to the first bipolar transistor; and
a second emitter wiring line and a second base wiring line which are placed on the insulating film and are connected to the second bipolar transistor,
each of the first bipolar transistor and the second bipolar transistor including
a collector layer, a base layer, an emitter layer, and an emitter mesa layer which are placed above the substrate, the emitter mesa layer being placed on a partial region of the emitter layer and having a shape that is long in a first direction in plan view,
a base electrode that is placed in a region not overlapping the emitter mesa layer in plan view, configured to flow a base current through the base layer, and includes a base electrode main portion and a base electrode pad portion, the base electrode main portion being spaced from the emitter mesa layer in a second direction orthogonal to the first direction and having a shape that is long in the first direction in plan view, the base electrode pad portion being spaced from the emitter mesa layer in the first direction and being continuous with the base electrode main portion, and an emitter electrode that is placed on the emitter mesa layer and configured to flow an emitter current through the emitter mesa layer, wherein the insulating film include an emitter contact hole and a base contact hole included within the emitter electrode and the base electrode pad portion, respectively in each of the first bipolar transistor and the second bipolar transistor in plan view, the first emitter wiring line is connected to the emitter electrode in the first bipolar transistor via the emitter contact hole, the first base wiring line is connected to the base electrode pad portion in the first bipolar transistor via the base contact hole, the second emitter wiring line is connected to the emitter electrode in the second bipolar transistor via the emitter contact hole, the second base wiring line is connected to the base electrode pad portion in the second bipolar transistor via the base contact hole, in the second bipolar transistor, a spacing between an edge of the emitter mesa layer on a side of the second base wiring line and an edge of the emitter contact hole on a side of the second base wiring line is smaller than a spacing between the emitter mesa layer and the second base wiring line in the first.

11. The semiconductor device according to claim 10, wherein in the second bipolar transistor, a minimum value of a spacing between the base electrode and the emitter mesa layer is less than a value of a spacing between an edge of the second base wiring line on a side of the second emitter wiring line and an edge of the second emitter wiring line on a side of the second base wiring line.

12. The semiconductor device according to claim 10, wherein in the second bipolar transistor, a spacing between an edge of the second base wiring line and an edge of the emitter mesa layer in the first direction is from 1.5 µm to 2.5 µm.

13. The semiconductor device according to claim 10, wherein in the second bipolar transistor and in the first direction, a spacing between an edge of the emitter electrode on a side of the second base wiring line and the edge of the emitter contact hole on a side of the second base wiring line is smaller than a spacing between the emitter electrode and the base electrode.

14. The semiconductor device according to claim 10, wherein in the second bipolar transistor and in the first direction, the spacing between the edge of the emitter mesa layer on a side of the second base wiring line and the edge of the emitter contact hole on a side of the second base wiring line is smaller than a spacing between the emitter mesa layer and the base electrode pad portion.

15. The semiconductor device according to claim 10, wherein in the second bipolar transistor, the spacing between the edge of the emitter electrode on a side of the second base wiring line and the edge of the emitter contact hole on a side of the second base wiring line in the first direction is less than or equal to 0.5 µm.

16. The semiconductor device according to claim 10, wherein in the second bipolar transistor, the second emitter wiring line is placed inside both ends of the emitter layer in the first direction.

17. The semiconductor device according to claim 10, further comprising:

an insulating protection film that is placed on the second emitter wiring line and includes a bump-wiring line contact hole within which the second emitter wiring line is included in plan view; and a bump that is placed on the protection film and is electrically connected to the second emitter wiring line via the bump-wiring line contact hole.

18. A semiconductor device comprising:

at least one first bipolar transistor that is provided at a substrate and configured as a driver-stage amplifier;

at least one second bipolar transistor that is provided at a substrate and configured as a power-stage amplifier;

an insulating film covering the first bipolar transistor and the second bipolar transistor;

a first emitter wiring line and a first base wiring line which are placed on the insulating film and are connected to the first bipolar transistor; and a second emitter wiring line and a second base wiring line which are placed on the insulating film and are connected to the second bipolar transistor, each of the first bipolar transistor and the second bipolar transistor including a collector layer, a base layer, an emitter layer, and an emitter mesa layer which are placed above the substrate, the emitter mesa layer being placed on a partial region of the emitter layer and having a shape that is long in a first direction in plan view, a base electrode that is placed in a region not overlapping the emitter mesa layer in plan view, configured to flow a base current through the base layer, is spaced from the emitter mesa layer in a second direction orthogonal to the first direction, and an emitter electrode that is placed on the emitter mesa layer and configured to flow an emitter current through the emitter mesa layer, wherein the insulating film includes an emitter contact hole included within the emitter electrode in each of the first bipolar transistor and the second bipolar transistor in plan view, the first emitter wiring line is connected to the emitter electrode in the first bipolar transistor via the emitter contact hole, the second emitter wiring line is connected to the emitter electrode in the second bipolar transistor via the emitter contact hole, in the second bipolar transistor, an arrangement among an edge of the emitter electrode, an edge of the emitter contact hole and an edge of the second emitter wiring line on one side in the first direction is substantially symmetrical to an arrangement among an edge of the emitter electrode, an edge of the emitter contact hole and an edge of the second emitter wiring line on the other side in the first direction, and in the first bipolar transistor, an arrangement among an edge of the emitter electrode, an edge of the emitter contact hole and an edge of the first emitter wiring line on one side in the first direction is not symmetrical to an arrangement among an edge of the emitter electrode, an edge of the emitter contact hole and an edge of the first emitter wiring line on the other side in the first direction.

* * * * *